United States Patent
Wakamoto et al.

(10) Patent No.: US 6,455,214 B1
(45) Date of Patent: Sep. 24, 2002

(54) SCANNING EXPOSURE METHOD DETECTING FOCUS DURING RELATIVE MOVEMENT BETWEEN ENERGY BEAM AND SUBSTRATE

(75) Inventors: Shinji Wakamoto, Tokyo; Yuji Imai, Omiya; Masayoshi Yamazaki, Funabashi; Osamu Furukawa, Tokyo, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/523,293

(22) Filed: Mar. 10, 2000

Related U.S. Application Data

(63) Continuation of application No. 09/167,550, filed on Oct. 7, 1998, which is a continuation-in-part of application No. 09/046,539, filed on Mar. 24, 1998, now abandoned.

(30) Foreign Application Priority Data

| Mar. 24, 1997 | (JP) | ............................................. 9-088732 |
| Apr. 11, 1997 | (JP) | ............................................. 9-110379 |
| Aug. 28, 1997 | (JP) | ............................................. 9-247916 |
| Oct. 7, 1997 | (JP) | ............................................. 9-290374 |
| Jan. 29, 1998 | (JP) | ........................................... 10-032087 |

(51) Int. Cl.[7] ............................................... G03F 9/00

(52) U.S. Cl. ............................................ 430/30; 430/22
(58) Field of Search ....................................... 430/30, 22

(56) References Cited

U.S. PATENT DOCUMENTS

| 5,448,322 A | 9/1995 | Bacs, Jr. ...................... 354/112 |
| 5,448,332 A | 9/1995 | Sakakibara et al. ............ 355/53 |
| 5,448,333 A | 9/1995 | Iwamoto et al. ............... 355/53 |
| 5,737,063 A | 4/1998 | Miyachi ........................ 355/53 |
| 5,770,337 A | 6/1998 | Chiang ......................... 430/22 |
| H1774 H | 1/1999 | Miyachi et al. ................ 355/67 |

FOREIGN PATENT DOCUMENTS

EP      0 702 272      3/1996

*Primary Examiner*—Christopher G. Young

(57) ABSTRACT

The present invention relates, to an exposure method, exposure apparatus, and the like having a configuration for effectively preventing color inconsistencies from occurring due to defocusing upon scanning exposure. In particular, the exposure method and apparatus according to the present invention control the scanning exposure according to the positional relationship between a substrate and a detection area for detecting a focus state of the substrate, the positional relationship between individual shot areas on the substrate the positional relationship between a shot area on the substrate and an edge of the substrate, or the like.

25 Claims, 22 Drawing Sheets

SCANNING EXPOSURE METHOD DETECTING FOCUS DURING RELATIVE MOVEMENT BETWEEN ENERGY BEAM AND SUBSTRATE

RELATED APPLICATION

This is a continuation of application of Ser. No. 09/167,550 filed Oct. 7, 1998, now pending, which in turn is a continuation-in-part of Ser. No. 09/046,539 filed Mar. 24, 1998 now abandoned.

BACKGROUND OF THE INVENTION

1. Field of the Invention

The present invention relates to techniques related to scanning type exposure apparatus and the like; and, in particular, to a scanning type exposure method, apparatus, device manufacturing method, and the like used when manufacturing semiconductor devices, liquid crystal display devices, and the like by lithography process.

2. Related Background Art

Conventionally used in the lithography process for manufacturing semiconductor devices, liquid crystal display devices, and the like are projection exposure apparatus which project and expose, by way of a projection optical system, a pattern formed in a mask or reticle (hereinafter referred to as reticle) onto a substrate such as wafer or glass plate (hereinafter referred to as photosensitive substrate or wafer) coated with photoresist or the like. Of apparatus of this kind, in the main stream have conventionally been stationary type (also known as step-and-repeat system) exposure apparatus which move a wafer stage carrying a wafer as a photosensitive substrate mounted thereon stepwise by a predetermined amount in two-dimensional directions of X and Y, and then transfer a reticle pattern to a shot area on the photosensitive substrate by way of a projection optical system. As the circuit pattern is becoming finer as the semiconductor devices have a higher degree of integration, however, much higher resolution and exposure accuracy have been demanded as performances of the exposure apparatus. Known as an exposure apparatus responding to such a demand are scanning type exposure apparatus of so-called step-and-scan system which sequentially transfer a reticle pattern onto a water by way of a projection optical system by moving a reticle stage holding a reticle and a water stage in a predetermined scanning direction relative to the projection optical system.

SUMMARY OF THE INVENTION

Having studied the above-mentioned scanning type exposure apparatus, the inventor has found the following problems. Namely, in the conventional scanning type exposure apparatus, when exposing a reticle pattern onto a certain shot area on a wafer, it is necessary that information (focus information) about the position of the wafer surface along the optical axis direction of the projection optical system (the position indicating the focus state of the exposure area) at the exposure position (within the shot area to be exposed) be measured with a focus sensor immediately before the exposure, and then scanning exposure be carried out while a sample table (z stage) which is minutely movable in the optical axis direction with a wafer held thereby is being positioned such that the shot area surface on the water falls within the depth of focus of the projection optical system.

In such a scanning type exposure apparatus, the focus information of the wafer immediately before starting exposure can easily be detected without any problem in the shot areas other than those located in marginal portions of the wafer. In the case of exposure of a shot area in a marginal portion of the wafer, however, when the wafer surface is displaced along the optical axis direction beyond the trackability of the z stage, a reticle pattern is disadvantageously exposed onto this shot area in a defocused state.

When carrying out exposure while relatively scanning the exposure area conjugate with the illumination area on the reticle from a marginal portion including an edge of the wafer surface to the inside (such an expression being used here for the convenience of explanation though the wafer actually moves while the exposure area is fixed), there has conventionally been employed a method in which exposure is performed while the exposure area is always relatively scanned from the inside of the wafer surface to the marginal portion or a method in which focus sensors to be used are selectively added depending on the position or form of the effective area for exposure shot. In the case where exposure in carried out while relatively scanning from the inside of the wafer surface to the marginal portion, by contrast, though exposure in a defocused state is seen, such a state has been left as it is without no counter measures provided.

In view of such circumstances, it is an object of the present invention to provide aim exposure method, an exposure apparatus, and the like comprising a configuration which can further effectively prevent color inconsistencies from occurring due to defocusing upon exposure.

In order to achieve the above-mentioned object, the exposure method according to the present invention is a scanning type exposure method, as shown in FIG. 5, in which, while a reticle and a substrate are moved relative to each other in a predetermined scanning direction with respect to a projection optical system, a pattern formed in the reticle is sequentially transferred onto the substrate by way of the projection optical system, the method comprising a focus detection stop for detecting positions of a surface of the substrate in an optical axis direction of the projection optical system at a plurality of detection points on the substrate with a multipoint focus sensor; a substrate driving stop of driving the substrate in the optical axis direction of the projection optical system or obliquely with respect to a plane orthogonal to the optical axis; a control step of controlling the driving of the substrate in the substrate driving step; and a judging stop (ST3) for judging, when a sensor in a usable state in the multipoint focus sensor and a predetermined shot area on the substrate have a predetermined relationship with each other, whether the sensor in the usable state is sensible or not; the control step performing, according to a result of the judgment, at least one of a first adjustment operation for adjusting the position of the substrate along the optical axis direction (thickness direction of the substrate) or a second adjustment operation for adjusting the inclination of the substrate.

In this specification, the sensor in a usable state refers to a sensor specified by a user, a sensor used in the immediately preceding scanning exposure step, or the like, which is a sensor, of a sensor group prepared (arranged) beforehand, whose switch is turned on so as to be set to a detection state.

Since the method according to the present invention comprises a judging step for judging whether sensors in the usable state are located within the effective area of the substrate or not, i.e., whether sensible or not, it can be judged whether or not these sensors can be used for controlling the position of the substrate and the like. Further, since the method according to the present invention has an exposure control step, the position of the surface of the substrate and the like can be controlled according to at least one of the first adjustment operation for adjusting the position of the substrate in the optical axis direction (focal position) and the second adjustment operation for adjusting the inclination of the substrate.

Here, it is preferred that the case where the predetermined relationship exists in the judging step be the case where the sensor in the usable state is located at an exposure end position of the predetermined shot area.

As a consequence, when exposure is carried out while the exposure area is relatively scanned from the inside of the wafer surface to a marginal portion including an edge, even upon the exposure of a shot area in the marginal portion, a focusing control operation or a focusing/leveling control operation combining focusing control and leveling control together is appropriately carried out.

In the present invention, the sensor in the usable state may be a follow-up sensor selected in the preceding processing. In this case, the judging step can immediately be carried out without newly selecting a sensor.

As for the adjustment operation determined by the arrangement of sensors, the inclination of the substrate is adjusted with respect to the predetermined scanning direction in the case where the detection points corresponding to the sensors in the usable state include detection points arranged in the predetermined scanning direction. On the other hand, the inclination of the substrate is adjusted with respect to a direction orthogonal to the predetermined scanning direction in the case where the sensors in the usable state include the sensors corresponding to detection points arranged in the direction orthogonal to the predetermined scanning direction. Thus, possible inclination adjustment can be performed according to the arrangement of sensors.

In the judging step, a shot up in which the form of each shot area on the substrate is recorded may be prepared, and the judgment in the judging step may be effected according to the shot map. When the form, arrangement, and the like of each shot area are known beforehand, these items may be stored in the shot map as information and the judgment can be effected by combining this information with the arrangement of sensors in the exposure apparatus used, characteristics of the exposure apparatus such an response speed, and the like.

Another exposure method according to the present invention is an exposure method in which, while a reticle and a substrate are moved relative to each other in a predetermined scanning direction with respect to a projection optical system, a pattern formed in the reticle is sequentially transferred onto the substrate by way of the projection optical system, the method comprising a focus detection step for detecting positions of a surface of the substrate in an optical axis direction of the projection optical system at a plurality of detection points on the substrate with a multipoint focus sensor; a substrate driving step of driving the substrate in the optical axis direction of the projection optical system or obliquely with respect to a plane orthogonal to the optical axis of the projection optical system; a control step of controlling the driving of the substrate in the substrate driving step; a step of preparing a map which specifies a sensible sensor when located at an exposure end position in a predetermined shot area on the substrate; and a step of determining an arrangement of a sensor in a usable state according to the map; the control step performing at least one of a first adjustment operation for adjusting the position of the substrate along the optical axis direction or a second adjustment operation for adjusting the inclination of the substrate, each of which is an adjustment operation determined by the arrangement of the sensor.

In this configuration, for example, when the form and arrangement of each shot area, the arrangement of the exposure apparatus used, characteristics of the exposure apparatus such as response speed, and the like are known beforehand, a map specifying a sensible sensor when located at the exposure end position in a predetermined shot area on the substrate can be prepared according to these data. Further, according to this map, an arrangement of sensors in the usable state can be determined. Then, in the exposure control step, in view of such an arrangement of sensors, one of the adjustment operation for adjusting the position of the substrate along the optical axis direction alone or the adjustment operation for adjusting the inclination of the substrate is performed thus allowing the driving of the substrate to be controlled according to the result of detection in the focus detection step.

The exposure method according to the present invention may include an automatic selection step of changing the arrangement of sensors in the usable state according to the result of the judging step.

In this method, at the automatic 9 election step, focus sensors fulfilling a predetermined standard may be selected according to a predetermined order.

In such a configuration, when the predetermined standard is defined as the most inside and outside of the first row, for example, width covered by sensors can be made greater, thus enhancing the possibility of leveling. Also, when the predetermined order is determined such that, for example, the sensors contributing to leveling are selected earlier than those simply contributing to focusing, the leveling that has conventionally been abandoned can be carried out as well.

The exposure apparatus according to the present invention is as shown in FIG. 1, an exposure apparatus 100 which, while scanning a reticle R and a wafer W in synchronization with each other, transfers a pattern of the reticle R to a shot area IA (FIG. 2) on the wafer W by way of a projection optical system PL; the apparatus comprising a focus detection system 40, 42 for detecting positions of the wafer W in the direction of an optical axis AX of the projection optical system at a plurality of detection points on the wafer W with a plurality of focus sensors $S_{12}$ to $S_{53}$ (FIG. 3) set; a driving mechanism 21 for driving the wafer W in the direction of the optical axis AX or obliquely with respect to a plans orthogonal to the optical axis AX; a judging section for detecting whether the focus sensors are sensible or not according to a positional relationship between the focus sensors, the wafer, and the shot area; and a control system for controlling scanning exposure in the shot area.

In this case, the control system may be configured such as to adjust, according to the result of judgment by the judging section, at least one of the position of the wafer in the direction along the optical axis AX and the inclination of the wafer.

In the present invention, the control system may be configured such as to change the setting of the focus sensors according to the form of a shot area located in a marginal portion including an edge of the wafer.

In the present invention, the control system may be configured such as to change the setting of the focus sensors according to the difference in length between both ends of the shot area in the scanning direction.

The device manufacturing method according to the present invention is a device manufacturing method in which, while a reticle and a wafer are scanned in synchronization with each other, a pattern of the reticle is transferred to a shot area on the wafer, so as to make a semiconductor device on the wafer; the method comprising the steps of detecting focus positions at a plurality of detection points on the substrate with a plurality of focus sensors and driving the substrate into a focusing direction or obliquely driving the substrate surface; judging whether the focus sensors are sensible or not according to a positional relationship between the focus sensors, the substrate, and the shot area; adjusting at least one of the position of the substrate in the optical axis direction and the inclination of the substrate with the focus sensors determined according to a result of the judgment; and exposing the pattern of the reticle onto the adjusted substrate.

As a consequence, in a marginal area of the substrate, for example, focus control or leveling control is appropriately effected as much as possible, whereby devices such as those of semiconductor and the like can be manufactured while satisfying both exposure accuracy and throughput as a whole.

In the present invention, the control system can effect scanning exposure according to not only the positional relationship between the substrate and the detection area but also the positional relationship between shot areas on the substrate, and the positional relationship between a shot area an the substrate and an edge of the substrate.

Specifically, the judging section judges a first condition that the distance from a shot area in which scanning exposure has been completed to the next shot area, to be subjected to scanning exposure in at least a predetermined value, and a second condition that a detection point, included within the detection area, corresponding to a sensor in the usable state intersects an edge of the substrate as the substrate moves. According to the result of this judgment, the control system performs a predetermined scanning exposure operation. For example, when both of the first and second conditions are satisfied, at least one of first and second control operations is selectively carried out.

Preferably, the positional relationship between a shot area on the substrate and an edge of the substrate is given by the distance between an exposure start position or exposure and position in a predetermined shot area on the substrate and the edge.

Namely, when satisfied is the first condition that the distance from the exposure start position in the shot area to the edge of the substrate along the scanning direction is at least a first value while at least three of the plurality of detection points exist on the substrate at the time of starting exposure, the control system carries out the first and second adjustment operations. When satisfied is the second condition that the distance from the exposure start position in the shot area to the edge of the substrate along the scanning direction is lose than the first value but at least a second value smaller than the first value while, of detection points arranged on a line orthogonal to the scanning direction and located on the substrate, detection points at both ends are separated from each other by at least a predetermined distance, the control system carries out the first and second adjustment operations. When neither of the first and second conditions is satisfied, the control system carries out only the first adjustment operation.

On the other hand, when satisfied is a third condition that the distance from the exposure end position in the shot area to the edge of the substrate along the scanning direction is at least a third value while at least three of the plurality of detection points exist on the substrate at the time of terminating exposure, the control system carries out the first and second adjustment operations. When satisfied is a fourth condition that the distance from the exposure end position in the shot area to the edge of the substrate along the scanning direction is less than the third value but at least a fourth value smaller than the third value while, of detection points arranged on a line orthogonal to the scanning direction and located on the substrate, detection points at both ends are separated from each other by at least a predetermined distance, the control system carries out the first and second adjustment operations. When neither of the third and fourth conditions is satisfied, the control system carries out only the first adjustment operation.

The present invention may further comprise a plurality of sensors respectively corresponding to a plurality of detection points included within a detection area of the focus detection system; and a sensor selecting mechanism for selecting, of the plurality of sensors, a sensor used for adjusting the position of the substrate by the control system. Here by way of the sensor selecting mechanism, the control system selects a sensor located on the substrate at an exposure start position or exposure end position among the plurality of detection points.

More preferably, upon scanning exposure of the shot area on the substrate, the control system carries out at least one of the first operation for adjusting the position of the substrate in the thickness direction and the second adjustment operation for adjusting the inclination of the substrate according to detection information obtained from the focus detection system, and information obtained upon immediately preceding scanning exposure.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention are given by way of illustration only, since various changes and modifications within the spirit and scope of the invention will become apparent to those skilled in the art from this detailed description.

DETAILED DESCRIPTION OF THE PREFERRED EMBODIMENTS

In the following, a scanning type exposure apparatus suitable for carrying out the present invention, and embodiments of the present invention will be explained with reference to FIGS. 1 to 30.

Figure 1:
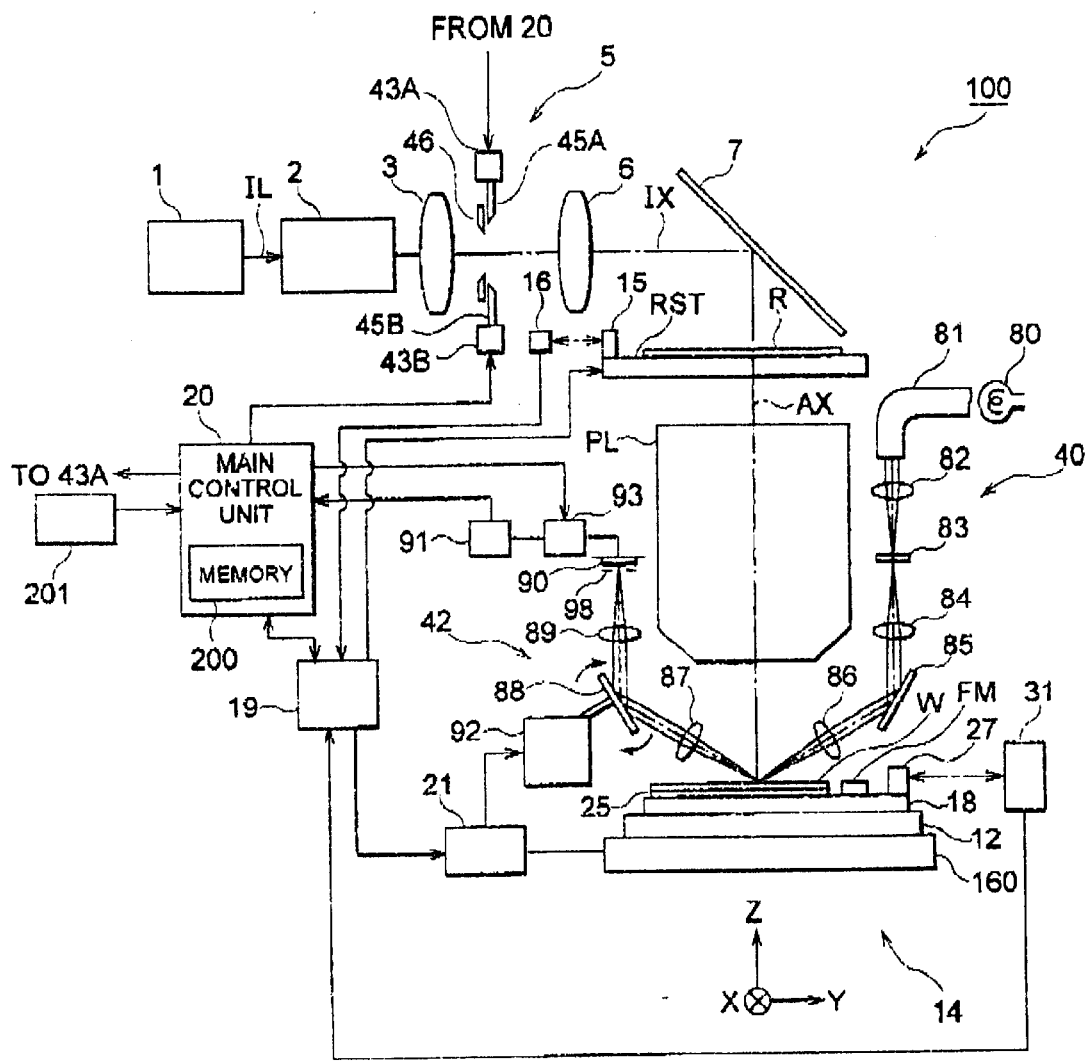
FIG. 1 is a view showing a schematic configuration of a scanning type exposure apparatus applicable to the present invention.

FIG. 1 is a view showing a schematic configuration of a scanning type exposure apparatus 100 suitable for carrying out the present invention. This scanning type exposure apparatus 100 is a so-called step-and-scan exposure type projection exposure apparatus.

The scanning type exposure apparatus 100 comprises an illumination system including a light source 1 and an illumination optical system (2, 3, and 5 to 7); a reticle stage RST for holding a mask or reticle (hereinafter referred to as reticle), a projection optical system PL; an XY stage unit 14 equipped with a substrate table 18, movable within XY plane orthogonal to z axis which is in parallel with the optical axis of the projection optical system, while holding a wafer W as a photosensitive substrate; a stage control system 19 for controlling these stages; and so forth.

The illumination system includes the light source 1; an illuminance homogenizing optical system 2 composed of a collimator lens, a flyeye lens , and the like; a relay lens 3; a reticle blind 5; a relay lens 6; a beading mirror 7; and so forth (among which the illuminance homogenizing optical system 2, the relay lenses 3 and 6, and the bending mirror 7 constitute the illumination optical system).

Here, each constituent of the illumination system will be explained together with its operation. After passing through a shutter, illumination light IL as exposure light generated at the light source 1 is converted by the illuminance homogenizing optical system 2 into a luminous flux having substantially a uniform illuminance distribution. As the illumination light IL, for example, excimer laser light such as KrF excimer laser light, ArF excimer laser light , or F2 excimer laser; harmonics of copper vapor laser or YAG laser; ultraviolet emission lines (g-line, i-line, etc.) from an extra-high pressure mercury lamp; and the like can be used.

The luminous flux horizontally-emitted from the illuminance homogenizing optical system 2 reaches the reticle blind 5 by way of the relay lens 3. The reticle blind 5 is constituted by a movable blind having two sheets of movable blades 45A and 45B (hereinafter the movable blind being also referred to as movable blinds 45A and 45B when appropriate) and a stationary blind 46 with a fixed aperture form disposed near the movable blinds 45A and 45B. The surface where the movable blinds 45A and 45B are disposed is conjugate with the pattern surface of the reticle R. The stationary blind 46 is, for example, a field stay in which a rectangular aperture is surrounded by four pieces of knife edges, whereas the vertical gap of the rectangular aperture is defined by the movable blinds 45A and 45B. Accordingly, the width of a slit-like illumination area IAR (sea FIG. 2) illuminating the reticle R can be set to a desired size. The movable blinds 45A and 45B are driven by movable blind Driving mechanisms 43A and 43B in opening and closing directions. The operations of the movable blind driving mechanisms 43A and 43B are controlled by a main control unit 20 (included in the control system) according to masking information within a file known as a process program stored in a memory 200.

The luminous flux transmitted through the reticle blind 5 passes through the relay lens 6 so as to reach the bending mirror 7, where it is bent vertically downward, thereby illuminating the portion of the reticle R corresponding to the illumination area TAR where a circuit pattern or the like is written.

Onto the reticle stage RST, the reticle R is secured by vacuum suction, for example. In order to position the reticle, the reticle stage RST is configured so as to be minutely drivable within a plane perpendicular to the optical axis IX of the illumination optical system (coinciding with the optical axis AX of the projection optical system PL explained later) in a two-dimensional fashion (in X-axis direction and Y-axis direction orthogonal thereto, and rotational direction around Z axis orthogonal to both X and Y axes).

Also, the reticle stage RST is movable in a predetermined scanning direction (assumed to be Y-axis direction here) on a reticle base at a designated velocity by a reticle driving section constituted by a linear motor or the like. The reticle stage RST has such a moving stroke that the whole surface of the reticle , can traverse at least the optical axis IX of the illumination optical system.

Secured onto the reticle stage AST is a movable mirror 15 which reflects a laser beam from a reticle laser interferometer (hereinafter referred to as reticle interferometer) 16, whereby the position (displacement) of the reticle stage RST within the stage moving plane is always detected by the reticle interferometer 16, for example, at a resolution of about 0.5 to 1 nm. In practice, a movable mirror having a reflecting surface orthogonal to the scanning direction (Y-axis direction) and a movable mirror having a reflecting surface orthogonal to a non-scanning direction (x-axis direction) are disposed on the reticle stage RST, whereas the scanning direction and the non-scanning direction are respectively provided with one axis and two axes of reticle interferometers 16. In FIG. 1, however, they are represented by the movable mirror 15 and reticle interferometer 16.

The positional information of the reticle stage RST from the reticle interferometer 16 is fed to the stage control system 19 and, by way thereof, further to the main control unit 20. In response to an instruction from the main control unit 20, the stage control system 19 drives the reticle stage RST by way of a reticle driving section according to the positional information of the reticle stage RST.

Here, the initial position of the reticle stage RST is determined by a reticle alignment system such that the reticle , is accurately positioned at a predetermined reference position. Consequently, by simply measuring the position of the movable mirror 15 by the reticle interferometer 16, it is assured that the position of reticle R has been measured with a sufficiently high accuracy.

The projection optical system PL is placed below the reticle stage RST in FIG. 1. The direction of the optical axis AX of the projection optical system PL (coinciding with the optical axis IX of the illumination optical system) coincides with Z-axis direction. Employed as the projection optical system PL in this embodiment is a refractive optical system comprising a plurality of sheets of lens elements disposed along the direction of the optical axis AX with predetermined intervals so as to yield a both-side telecentric optical arrangement. The projection optical system PL is a demagnification optical system having a predetermined projection magnification, e.g., ⅕ (or ¼). Consequently, when the illumination area IAR of the reticle R is illuminated with the illumination light IL from the illumination optical system, the illumination light IL transmitted through the reticle R forms, by way of the projection optical system PL, a reduced image of the circuit pattern of the reticle R onto the wafer W (photosensitive substrate) whose surface is coated with photoresist.

The XY stage 14 has a Y stage 160 adapted to reciprocate on a non-depicted base in Y-axis direction (rightward and leftward in FIG. 1) which is the scanning direction; an X stage 12 adapted to reciprocate on the Y stage 160 in X-axis direction (orthogonal to the paper surface in FIG. 1) orthogonal to Y axis; and the substrate table 18 disposed on the X stage 12. Mounted on the substrate table 18 is a wafer holder 25, which holds the wafer W by vacuum suction.

The substrate table 18 is mounted on the X stage 12 in a state positioned in XY directions while being allowed to move and tilt in the Z-axis direction. The substrate table 18 is supported by non-depicted three shafts respectively at three supporting points different from each other. These three shafts are independently driven by a wafer driving unit 21 in Z-axis direction, whereby the surface position of the wafer W (defined by its position in Z-axis direction and inclination with respect of XY plane) held on the substrate table 18 is set to a desired state.

Secured onto the substrate table 18 is a movable mirror 27 which reflects a laser beam from a wafer laser interferometer (hereinafter referred to as wafer interferometer) 31. The position (displacement) of the substrate table 18 within XY plane is always detected by the wafer interferometer 31 disposed outside, for example, at a resolution of about 0.5 to 1 nm.

In practice, a movable mirror having a reflecting surface orthogonal to the scanning direction, Y-axis direction, and a movable mirror having a reflecting surface orthogonal to the non-scanning direction, X-axis direction, are disposed on the substrate table 18. On the other hand, the scanning direction and the non-scanning direction are respectively provided with one axis and two axes of wafer interferometers 31. In FIG. 1, however, they are represented by the movable mirror 27 and wafer interferometer 31. The positional information (or velocity information) of the substrate table 18 is fed to the stage control system 19 and, by way thereof, further to the main control unit 20. In response to an instruction from the main control unit 20, the stage control system 19 drives the Y stage 160 and X stage 12 by way of the wafer driving unit 21 (including all the driving systems of the X stage 12, Y stage 160, and substrate table 18) according to the positional information (or velocity information).

Also, secured onto the substrate table 18 is a reference mark plate FM formed with various kinds of reference marks for baseline measurement for measuring the distance from the detection center of an off-axis type alignment detecting system to the optical axis of the projection optical system PL and the like.

Figure 2:
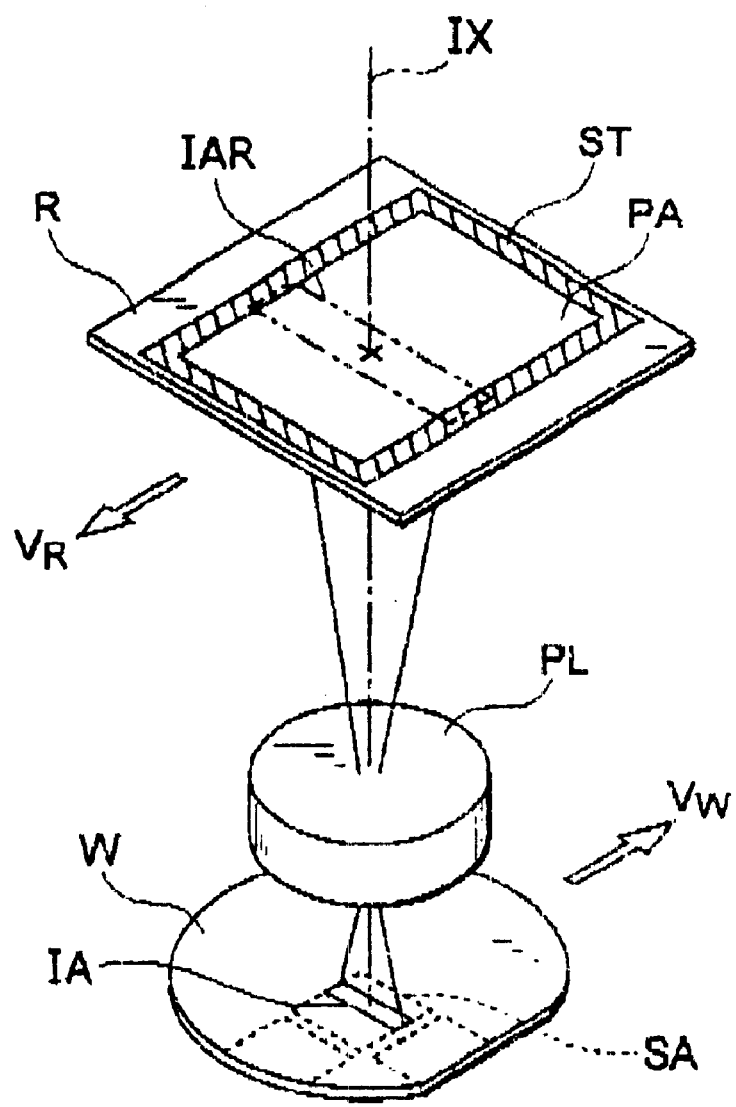
FIG. 2 is a view for explaining the principle of scanning exposure in the exposure apparatus shown in FIG. 1.

In the scanning type exposure apparatus 100 in this embodiment, as shown in FIG. 2, the reticle R is illuminated with the rectangular (slit-like) illumination area IAR whose longitudinal direction is perpendicular to the scanning direction (Y-axis direction) of the reticle R. At the time of exposure, the reticle R is scanned in −Y direction at a velocity $V_R$. An image of the illumination area IAR (whose center substantially coincides with the optical axis AX) is projected onto the wafer W by way of the projection optical system PL, thereby forming a slit-like projection area, i.e., exposure area IA, which is conjugate with the illumination area IAR. Since the wafer W and the reticle R are in an inverted imaging relationship with respect to each other, the wafer W is scanned at a velocity $V_W$ in the direction (+Y direction) opposite to the direction of the velocity $V_R$ in synchronization with the reticle R. As the exposure area IA and the whole surface of a shot area SA on the wafer W are thus moved relative to each other, the whole surface of the shot area (SA) is subjected to scanning exposure. The ratio $V_W/V_R$ of scanning velocities accurately corresponds to the demagnification of the projection optical system PL, whereby the pattern image of a pattern area PA of the reticle R is correctly transferred under demagnification onto the shot area SA on the wafer W. The longitudinal width of the illumination area IAR is set so as to be greater than that of the pattern area PA on the reticle R but smaller than the maximum width of a light-shielding area ST. As the reticle stage RST is scanned, the whole surface of the pattern area PA is illuminated.

In the scanning type exposure apparatus 100, at the time when scanning exposure is executed in each shot area, the main control unit 20 performs positioning (alignment) of the reticle R and wafer W with respect to each other by way of the stage control system 19, wafer driving unit 21, and the like according to a detection signal of an alignment detecting system. Also, according to a detection signal of a multipoint focus position detecting system which will be explained later, the main control unit 20 drives and controls the substrate table 18 is Z-axis direction and the tilted direction by way of the stage control system 19 and the wafer driving unit 21 such that the pattern surface of the reticle R and the wafer W surface become conjugate with each other with respect to the projection optical system PL and such that the imaging surface of the projection optical system PL and the wafer W surface coincide with each other (the wafer surface falls within the range of depth of focus of the best imaging surface of the projection optical system PL), whereby the surface position is adjusted (alignment surfaces are set).

In the scanning type exposure apparatus 100, as the transfer of the reticle pattern to the shot area on the wafer W by scanning exposure such as that mentioned above and the stepping operation to the scanning start position for the next shot area are repeatedly executed, a step-and-scan type exposure operation is performed, whereby the reticle pattern is transferred to all the shot areas on the wafer W.

The scanning type exposure apparatus 100 further comprises a multipoint focus position detecting system which is one of slanted incident light type focus detecting systems for detecting positions of the portion within the exposure area IA of the wafer W surface and areas in the vicinity thereof in Z direction (direction of the optical axis AX). The multipoint focus position detecting system is constituted, as shown in FIG. 1, by an irradiation optical system 40 comprising an optical fiber bundle 81, a condenser lens 82, a pattern forming plate 83, a lens 84, a mirror 85, and an irradiation objective lens 86; and a light-receiving optical system 42 comprising a condenser objective lens 87, a rotational direction vibrating plate 88, an imaging lens 89, a light-receiving slit plate 98, and a light-receiving device 90 having a number of photosensors.

Here, each constituent of the multipoint focus detecting system (40, 42) will be explained together with its operation. From an illumination light source 80, illumination light with a wavelength to which the photoresist on the wafer W is insensitive, different from the exposure light, is guided to the condenser lens 82 by way of the optical fiber bundle 81. The illumination light emitted from the optical fiber bundle 81 illuminates the pattern forming plate 83 by way of the condenser lens 82.

Formed on the pattern forming plate 83 are 45 pieces of slit-like aperture patterns arranged in a matrix of 5 rows by 9 columns. The illumination light transmitted through each slit-like aperture pattern of the pattern forming plate 83 (image luminous flux of the aperture pattern) is projected onto the exposure surface of the wafer W by way of the lens 84, mirror 85, and irradiation objective lens 86, whereby images of 5×9=45 slit-like aperture patterns in total on the pattern forming plate 83 are projected and formed onto the exposure surface of the wafer W. In practice, from a direction inclined with respect to the optical axis AX by a predetermined angle α, the image luminous flux of aperture patterns from the irradiation optical system 40 irradiates the wafer W surface (or the surface of the reference mark plate FM) within a plane forming an angle of 45 degrees with respect to each of YZ and XZ planes.

Figure 3:
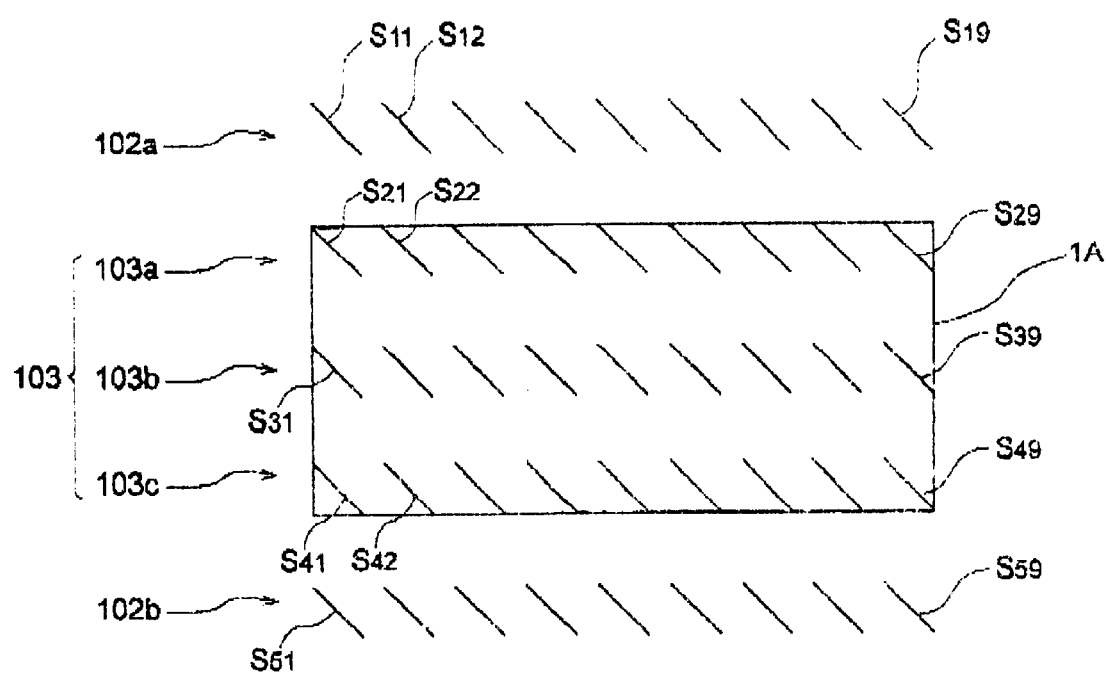
FIG. 3 is a view showing a positional relationship between an arrangement of slit images, which are individual detection points of a multipoint focus position detection system, and an exposure area.

Consequently, as shown in FIG. 3, in the vicinity of the exposure area IA of the wafer W surface, 5×9, i.e., 45 images of slit-like aperture patterns (hereinafter referred to as slit images) $S_{11}$ to $S_{59}$, in total, arranged in a matrix of 5 rows by 9 columns are formed along X-axis direction and Y-axis direction with substantially the same intervals. A reflected luminous flux of the luminous flux of the slit images $S_{11}$ to $S_{59}$ from the wafer W surface advances in a direction inclined with respect to the optical axis AX by the predetermined angle α symmetrically with the image luminous flux from the irradiation optical system 40 and forms images again onto the light-receiving slit plate 98, which is disposed in front of the light-receiving device 90, by way of the condenser objective lens 87, rotational direction vibrating plate 88, and imaging lens 89.

More specifically, on the light-receiving device 90, 45 pieces of photosensors $D_{11}$ to $D_{59}$ (see FIG. 4) are arranged in a matrix of 5 rows by 9 columns so as to respectively correspond to the slit images $S_{11}$ to $S_{59}$. The light-receiving slit plate 98 disposed at the front surface (lower surface in FIG. 1) of the light-receiving device 90 is formed with slits respectively facing the individual photosensors D, and the slit images $S_{11}$ to $S_{59}$ shown in FIG. 3 respectively re-form images on these slits.

The main control unit 20 accommodates an oscillator (OSC) therein. When a vibrator 92, which is driven by a driving signal from the OSC according to an instruction from the main control unit 20, applies a predetermined vibration to the rotational direction vibrating plate 88, the position of each of the images re-formed on the light-receiving slit plate 98 vibrates in a predetermined direction (direction orthogonal to the longitudinal direction of each slit of the slit plate 98). Consequently, detection signals of the respective photosensors $D_{11}$ to $D_{59}$ are synchronously detected by a signal processing unit 91 according to signals of rotationally vibrating frequencies by way of a sensor selecting circuit 93. Then, a number of focus signals synchronously detected by the signal processing unit 91 are supplied to the main control unit 20. The sensor selecting circuit 93 and signal processing unit 91 will be explained later. Between the imaging lens 89 and the slit plate 98, a plane-parallel for shifting the relative relationship between each slit on the slit plate 98 and the center of vibration of the reflected slit image from the wafer W toward a direction orthogonal to the longitudinal direction of each slit of the slit plate 98 may also be disposed.

As can be seen from the foregoing explanation, in the scanning type exposure apparats 100, the individual slit images $S_{11}$ to $S_{59}$, which are detection points on the wafer W, and the individual photosensors $D_{11}$ to $D_{39}$ on the light-receiving device 90 correspond to each other one by one. Consequently, the information of the position of each slit image on the wafer surface in Z-position (focus information) can be obtained according to the focus signal, which is an output from each photosensor D. Therefore, in the following explanation, the slit images $S_{11}$ to $S_{59}$ will be referred to as focus sensors unless it is necessary for them to be specified otherwise in particular.

Of the focus sensors $S_{11}$ to $S_{59}$, outputs of the focus sensors $S_{21}$ to $S_{29}$ in the second row, focus sensors $S_{31}$ to $S_{39}$ in the third row, and focus sensors $S_{41}$ to $S_{49}$ in the fourth row positioned within the exposure area IA in FIG. 3 are used for follow-up control of the substrate table 18 for setting the surface position within the exposure area IA. Consequently, these three rows of focus sensors are respectively referred to as follow-up sensors 103a, 103b, and 103c. Also, these three rows of focus sensors are collectively referred to as a follow-up sensor 103.

On the other hand, in this embodiment, outputs of the first row of focus sensors $S_{11}$ to $S_{19}$ and the fifth row of focus sensors $S_{51}$ to $S_{59}$ are used only for forecasting the next focus state, i.e., whether the wafer W surface changes in +Z or −Z direction. Hence, these two rows of focus sensors are referred to as pre-reading sensors 102a and 102b, respectively. Each of the pre-reading sensors 102a and 102b may be constituted by a plurality of rows of sensors as with the follow-up sensor 103. In this case, leveling control can also be forecasted.

Figure 4:
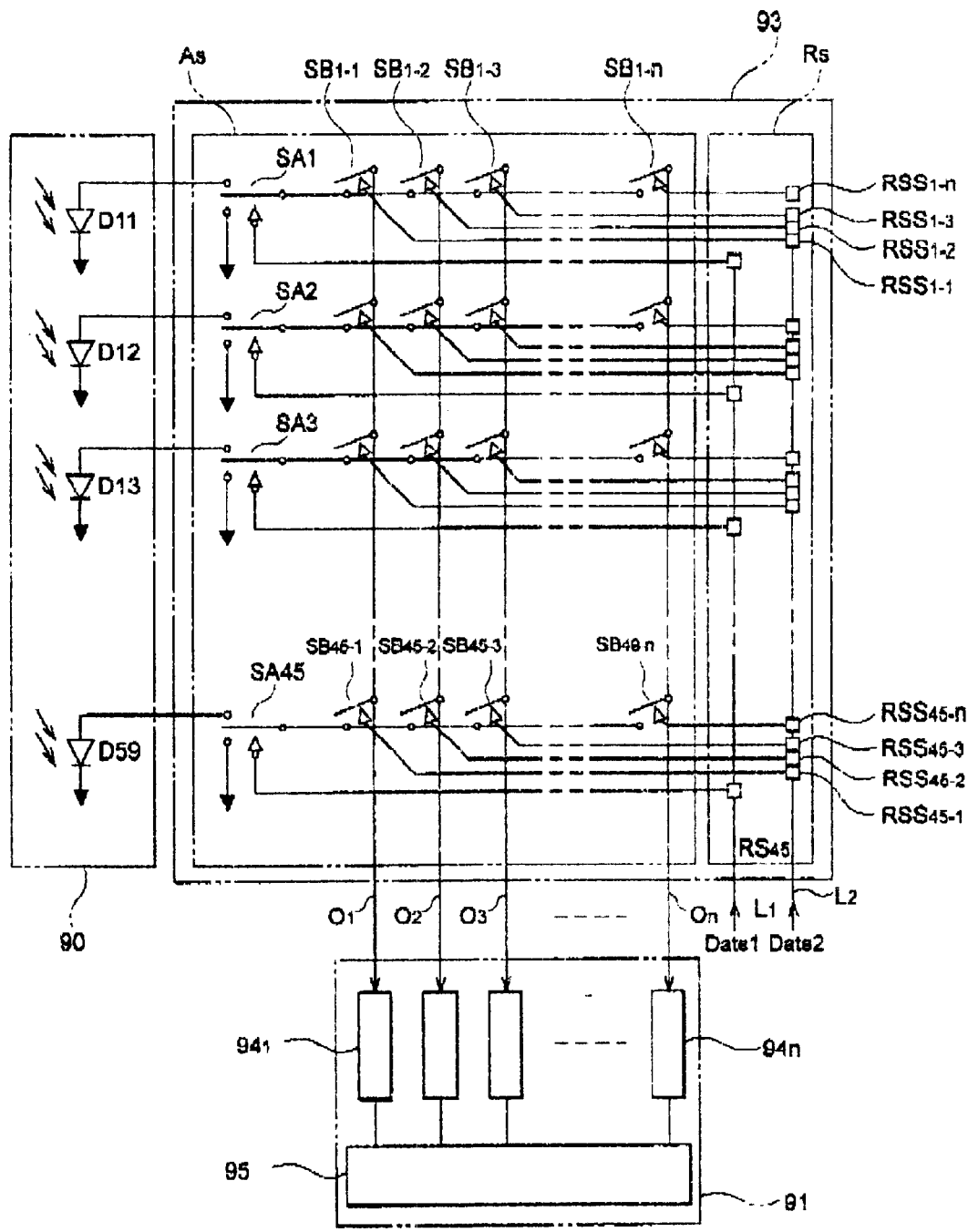
FIG. 4 is a view showing a schematic configuration of a sensor selecting circuit &Ad signal processing unit together with a light-receiving device.

In the following, configurations of the sensor selecting circuit 93 and signal processing unit 91 will be explained with reference to FIG. 4. This drawing schematically shows the sensor selecting circuit 93 and signal processing unit 91 together with the light-receiving device 90. Among them, the sensor selecting circuit 93 comprises a switch section $A_6$ and a register section $R_8$. Disposed within the switch section $A_6$ are changeover switches $SA_1$ to $SA_{48}$ in each of which one fixed contact is connected to the P side of its corresponding one of the photosensors (photodiodes herein) $D_{11}$, $D_{12}$, . . . , and $D_{59}$ to which a reverse bias voltage is applied; and (45×n) pieces of make-and-break switches $SB_{1-1}$, $SB_{1-2}$, $SB_{1-3}$, . . . , and $SB_{45-n}$ respectively disposed between movable contacts (common contacts) of the changeover switches $SA_1$ to $SA_{15}$ and n output lines $O_1$ to $O_n$. The other fixed contact of each of the changeover switches $SA_1$ to $SA_{45}$ is grounded. On the other hand, the N side of each of the photosensors $D_{11}$ to $D_{59}$ is connected to an unshown power supply circuit. The n output lines $O_1$ to $O_n$ for photoelectrically converted signals are respectively connected to signal processing circuits $94_1$ to $94_n$ disposed so as to correspond to these output lines.

As a result of the foregoing configuration, for example, when the changeover switch $SA_1$ is switched toward the photosensor $D_{11}$, and the make-and-break switch $SB_{1-1}$ is turned on, a reverse current (photocurrent, i.e., photoelectrically converted signal) with a strength in proportion to the intensity of light received by the photosensor $D_{11}$ flows within a closed circuit from the photosensor $D_{11}$ to the switch $SA_1$ and the switch $SB_{1-2}$, successively. This current is detected by the signal processing circuit $94_1$ and is converted thereby into a digital signal, which is sent to a signal output circuit 95. On the other hand, for example, when the changeover switch $SA_{45}$ is switched toward the photosensor $D_{59}$, and the make-and-break switch $SB_{45-n}$ is turned on, a reverse current (photocurrent) with a strength in proportion to the intensity of light received by the photosensor $D_{59}$ flows within a closed circuit from the photosensor $D_{49}$ to the switch $SA_{15}$ and the switch $SB_{45-n}$, successively. This current is detected by the signal processing circuit $94_n$ and is converted thereby into a digital signal, which is sent to the signal output circuit 95. Thus, in this apparatus, when a given combination of changeover switch SA and make-and-break switch SB is turned on, a photocurrent corresponding to the intensity of light received by any photosensor D can be taken out through a desired output line 0.

Disposed within the register section $R^6$ are 45 pieces of first registers $RS_1$ to $RS_{45}$ respectively disposed so as to correspond to the changeover switches $SA_1$ to $SA_{45}$; and 45 sets of second registers $RSS_{1-1}$ to $RSS_{45-n}$ disposed n by n so as to correspond to the make-and-break switches $SB_{1-1}$ to $SB_{45-n}$. The first registers $RS_1$ to $RS_{45}$ are commonly connected to a single line $L_1$, whereas the second registers $RSS_{1-1}$ to $RSS_{45-n}$ are commonly connected to a single line $L_2$. Consequently, for example, in order for the output of the photosensor $D_{11}$ to be fed to the output line $O_1$, Data 1 ("1, 0, 0, . . . , 0") and Data 2 ("1, 0, 0, 0, 0, 0, 0, 0, 0, 0, 0, 0, 0, 0, . . . , 0, 0, 0, 0, 0, 0, 0") are respectively fed into the lines $L_1$ and $L_2$. As a result, while the first register $RS_1$ and the second register $RSS_{1-1}$ are set to "1" the other registers become zero. Further, the changeover switch $SA_1$ is switched toward the photosensor $D_{11}$, and the make-and-break switch $SB_{1-1}$ is turned on, whereby the output of the photosensor $D_{11}$ is fed to the output line $O_1$. Thus, in this apparatus, depending on the contents of Data 1 and Data 2 fed into the register RS from the main control unit 20 respectively by way of the lines $L_1$ and $L_2$, the output of a desired photosensor D can be fed to a desired output line O, i.e., to the signal processing circuit 94 corresponding thereto. Thus, in the case where n=45, for example, when the individual photosensors D are respectively connected to the signal processing circuits $94_1$ to $94_n$ independently of each other, the main control unit 20 can compute the positions of focus sensors, which are individual detection points of the exposure area IA and within detection areas in front thereof and therebehind, in the optical axis direction.

The signal processing unit 91 comprises n pieces of signal processing circuits $94_1$ to $94_n$ respectively connected to the output lines $O_1$ to $O_n$. Each signal processing circuit 94 accommodates therein a synchronous detection circuit (PSD), into which an AC signal having a phase identical to that of the driving signal from the OSC is fed. By using the phase of the AC signal as a reference, each signal processing circuit 94 performs synchronous rectification (synchronous detection) of the signal from its corresponding output line, thereby generating a focus position detection signal (focus signal) FS corresponding to the Z-axis direction position (focus position) of the site of each of the slit images $S_{11}$ to $S_{59}$ on the wafer W. Then, the focus signals FS from the signal processing circuits $94_1$ to $94_n$ are digitally converted by the signal output circuits 94, so as to be fed to the main control unit 20 as serial data.

Meanwhile, each focus signal FS is a so-called S-curve signal which becomes zero level in the state where the slit center of the light-receiving slit plate 98 coincides with the vibration center of the reflected slit image from the wafer W, a positive level when the wafer W is displaced upward from this state, and a negative level when the wafer W is displaced downward from this state. Accordingly, when no offset is added to each focus signal FS, the height position (optical axis direction position) of the wafer W where each focus signal FS becomes zero level is detected by the main control unit 20 as an in-focus point.

As mentioned above, in this apparatus, the output of a desired photosensor D can be fed to a desired output line O, i.e., to a signal processing circuit 94 corresponding thereto. For example, in the case where a plurality of photosensors D are set to the same output destination, the signal processing circuit 94 designated (selected) as the output destination synchronously detects the combined signal of photosensor outputs according to the signal of rotational vibration frequency, whereby the digitally converted data of the focus signal corresponding to the combined signal of outputs of the plurality of photosensors are fed to the main control unit 20.

Since the pre-reading sensors 102a and 102b are used only for forecasting the next focus state as mentioned above, the photosensors $D_{11}$ to $D_{19}$ corresponding to the individual focus sensors of the pre-reading sensor 102a and the photosensors $D_{51}$ to $D_{59}$ corresponding to the individual focus sensors of the pre-reading sensor 102b are assumed to be outputted to their common output destinations, i.e., output lines $O_1$ and $O_n$, respectively, in the following explanation. In order for the photosensors $D_{21}$ to $D_{29}$, $D_{31}$ to $D_{39}$, and $D_{41}$ to $D_{49}$ corresponding to the individual focus sensors constituting the follow-up sensor 103 to be discretely connectable to output lines $O_2$ to $O_{(n-1)}$ which are different from each other, it is assumed, for example, n>29.

Further, in the scanning type exposure apparatus 100, as a method of focusing/leveling control when projecting and exposing a pattern of the reticle R onto each shot area on the wafer W, the following three different modes of control method are performed.

Namely, the first control method is normal auto-focusing/auto-leveling control in which the substrate table 18 is Z-driven and obliquely driven in X and Y directions according to the respective focus signals corresponding to the individual focus sensors constituting the follow-up sensor 103.

The second control method is irregular auto-focusing/leveling control in which the substrate table 18 is Z-driven and obliquely driven in X and Y directions according to the focus signals corresponding to a plurality of focus sensors constituting the follow-up sensor 103.

The third control method is auto-focusing control in which the substrate table 18 is only Z-driven according to the focus signal corresponding to at least one focus sensor constituting the follow-up sensor 103.

In the following, the focusing/leveling control in the main control unit 20 upon scanning exposure, including the judgment of the first to third control methods, will be explained with reference to the drawings. The flowcharts shown in FIGS. 5 to 9 actually constitute a part of an exposure processing program and, for example, are repeated upon every one-shot exposure before starting exposure of each shot area. Alternatively, the program indicated by the flowcharts may be executed before the exposure of one sheet of wafer W, so as to determine the mode of control method for each shot beforehand, according to which the exposure of the whole wafer W is carried out.

Figure 5:
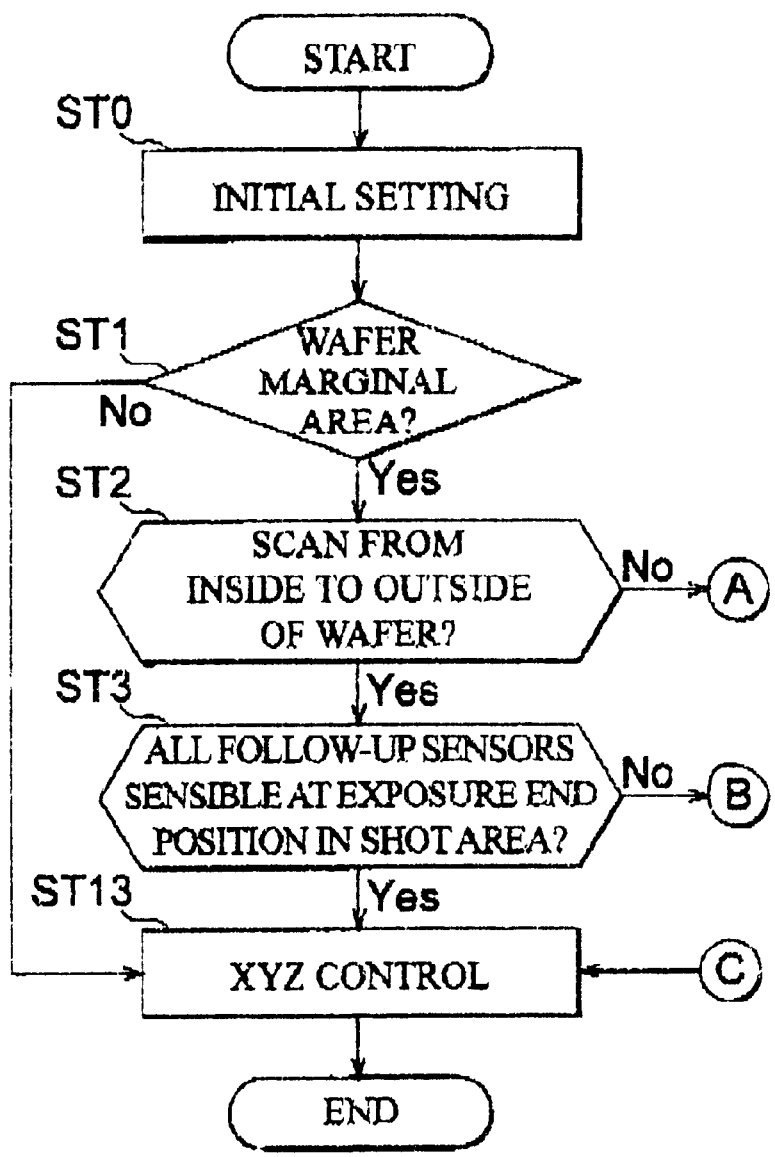
FIG. 5 is a flowchart for explaining first and second embodiments according to the present invention.

FIG. 5 is a flowchart for explaining the first embodiment according to the present invention. In this chart, at step ST0, various initial settings are registered into the control unit 20 by operator input 201 or writing into a process program. Effected in this embodiment are the initial designation of the sensors selected in the above-mentioned sensor selecting circuit 93 and the initial setting of algorithms for automatic selection of sensors at step ST23, ST34A, and the like which will be explained later. Namely, "1" and "2" are selected respectively when the number of sensors is automatically selected and not at steps ST23, ST34A and the like.

Here, $S_{22}$, $S_{26}$, $S_{42}$, $S_{46}$, and $S_{35}$ in FIG 3 are specified as the follow-up sensors, whereas $S_{52}$, $S_{55}$, and $S_{59}$ (in the case of scanning from the inside to outside of the wafer W surface) and $S_{12}$, $S_{15}$, and $S_{18}$ (in the case of scanning from the outside to inside of the wafer W surface) are specified as the pre-reading sensors. As the upper limit for the number of sensors which can be placed in a usable state upon exposure, any of 9 to 20, for example, is set into the control unit 20. For example, the number of initially specified sensors is set to 8 in total comprising 5 pieces of follow-up sensors and 3 pieces of pre-reading sensors, so as to be used within the range having an upper limit of 9. As a consequence, when scanning from the inside to outside of the wafer W surface, 5 pieces of follow-up sensors and 3 pieces of pre-reading sensors ($S_{52}$, $S_{55}$, and $S_{58}$) are initially specified. Also, when scanning from the outside to inside of the wafer W surface, 5 pieces of follow-up sensors and 3 pieces of pre-reading sensors ($S_{12}$, $S_{15}$, and $S_{18}$) are initially specified.

Next, at step ST1, it is judged whether the shot area to be exposed is a shot area in a marginal portion including an edge of the wafer W or not. The judgment at step ST1 is effected according to a preset order of exposure of shots (stored in the memory 200), a shot map, and the like. If this judgment is negative, then the flow proceeds to step ST13. Subsequently effected during the scanning exposure of this shot area is normal auto-focusing/auto-leveling (automatic tilting) control in which the wafer driving unit 21 is controlled by way of the stage control system according to the respective focus signals from the follow-up sensors 103 in the multipoint focus position detection system (40, 42) so as to subject the substrate table 18 to X- and Y-tilting (inclination) and position control in Z direction. Thereafter, this routine is terminated.

If the judgment at step ST1 is positive, by contrast, then the flow proceeds to step ST2, where it is judged whether or not the exposure area IA is relatively scanned from the inside toward outer peripheral portion of the wafer W upon exposure of this shot area.

If this judgment is negative, then the flow proceeds to step ST41. The processing at step ST41 and thereafter will be explained later.

If the judgment at step ST2 is positive, by contrast, then the flow proceeds to its subsequent step ST3, where it is judged whether, when the initially set follow-up sensors (the follow-up sensors in the last row concerning the scanning from the inside to outside of the substrate surface), which are in the usable state defined in the present invention, are located at the exposure end position of the shot area, all the initially set follow-up sensors are sensible or not. Namely, it is judged whether or not all the follow-up sensors specified according to the initial setting are located within the effective area of the wafer W.

Since how much the shot area is distanced from a wafer edge is seen from the coordinates of the wafer edge, the shot map, and the like, and the relative positional relationship between the scanning end position and the focus sensors is known, the judgment is done, based on these data, according to whether or not all the sensors are located within the effective area of the wafer W. Since a marginal portion of the wafer is usually provided with a pattern inhibition band, the effective area of the wafer W refers to the inside of the band. As a consequence, the wafer edge indicates the inside of the pattern inhibition band.

If the judgment at step ST3 is positive, then the flow proceeds to step ST13. Subsequently effected is normal auto-focusing/auto-leveling (automatic tilting) control in which the substrate table 18 is subjected to X- and Y-tilting (inclination) and position control in Z direction.

Figure 6:
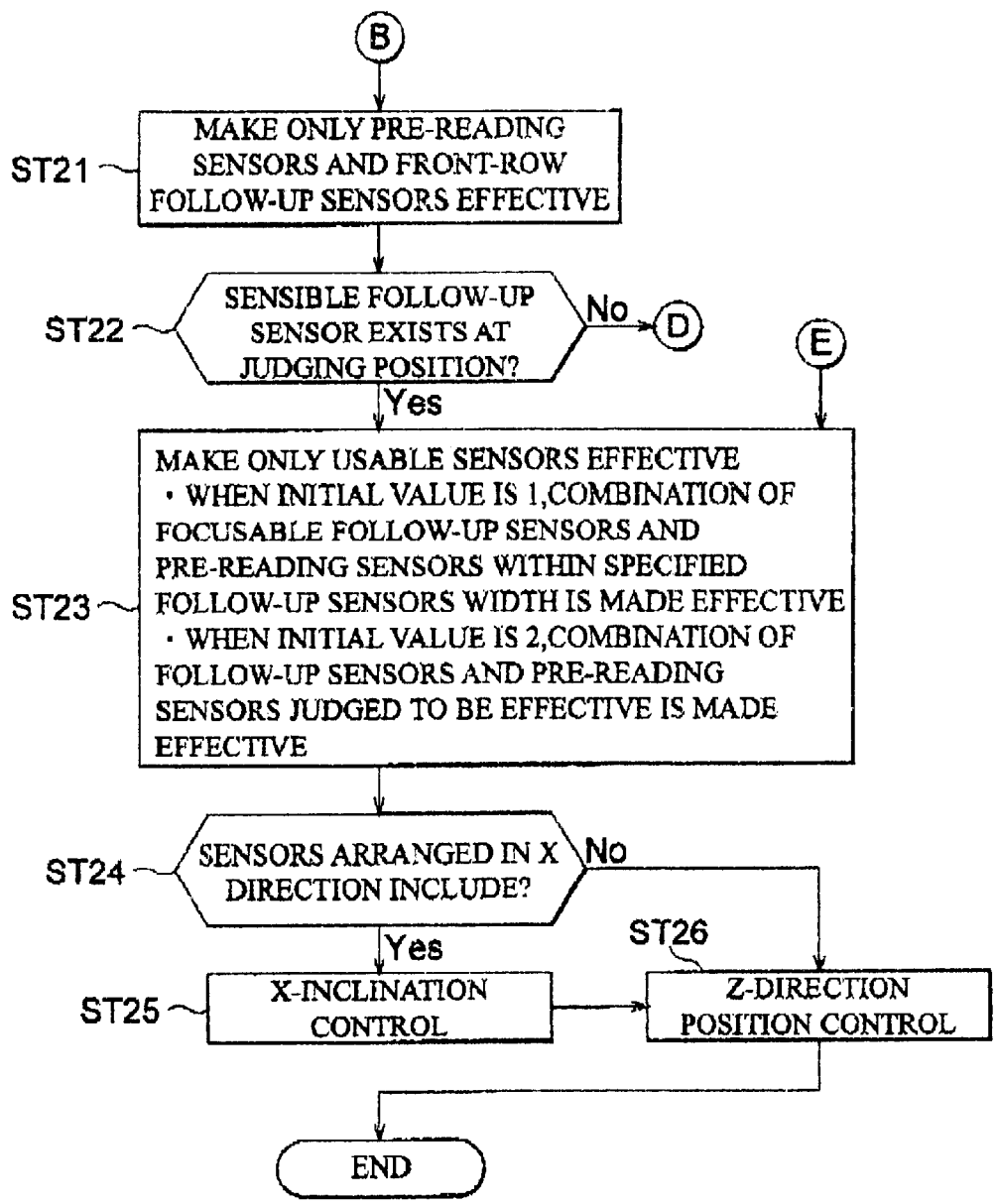
FIG. 6 is a (first) flowchart for explaining the first embodiment according to the present invention.

If the judgment at step ST3 is negative, then the flow proceeds to step ST21 (FIG. 6). At step ST21, the tilting control in Y direction (scanning direction) is abandoned, and only the pre-reading sensors and the follow-up sensors in the front row (the follow-up sensors in the front row concerning the scanning from the inside to outside of the wafer surface) are set effective in order to judge whether the tilting control in X direction and focusing control are possible or not. Then, the flow proceeds to step ST22.

At step ST22, it is judged whether or not, among the sensors set at step ST21, at least one follow-up sensor capable of focusing exists when the follow-up sensors at the judgment position, i.e., in the front row, are located at the exposure end position. If this judgment is positive, then only the usable sensors are set effective (step ST23).

Here, in the case where the initial setting at step ST0 is set to "1" by which sensors are automatically selected (increased), follow-up sensors capable of sensing (focusing) are judged within the width of follow-up sensors specified at step ST22 (maximum width of specified follow-up sensors concerning X direction), and a combination of the follow-up sensors judged to be sensible and the pre-reading sensors aligning therewith in the same column (the pre-reading sensors paired with the sensible sensors) is made effective.

In the case where the initial setting at step ST0 is set to "2" by which sensors are not automatically selected (not increased), a combination of the follow-up sensors judged to be effective at step ST22 and the pre-reading sensors paired with these follow-up sensors is set effective.

In the scanning exposure from the inside to outside of the wafer W surface, pre-reading sensors would be located near the outer edge of the wafer W or outside of the wafer W surface. Consequently, since the follow-up sensors are capable of focusing independently of the pre-reading sensors even when the latter become incapable of focusing, it is sufficient for the focusing to be ensured only when the follow-up sensors are located within the exposure area. Nevertheless, since the pre-reading sensors and follow-up sensors are preferably used in combination, the above-mentioned way of selection is effected.

Subsequently, at step ST24, it is judged whether or not the (follow-up) sensors thus set effective include sensors arranged in X direction with a spacing sufficient for effecting the inclination control in X direction (step ST24). If the judgment is positive, then the inclination control in X direction is performed (step ST25), and the position control in Z direction is performed (step ST26). If there are no sensors arranged in X direction, thus making it impossible to effect the inclination control in X direction, then the position control in Z direction is performed (step ST26).

Figure 7:
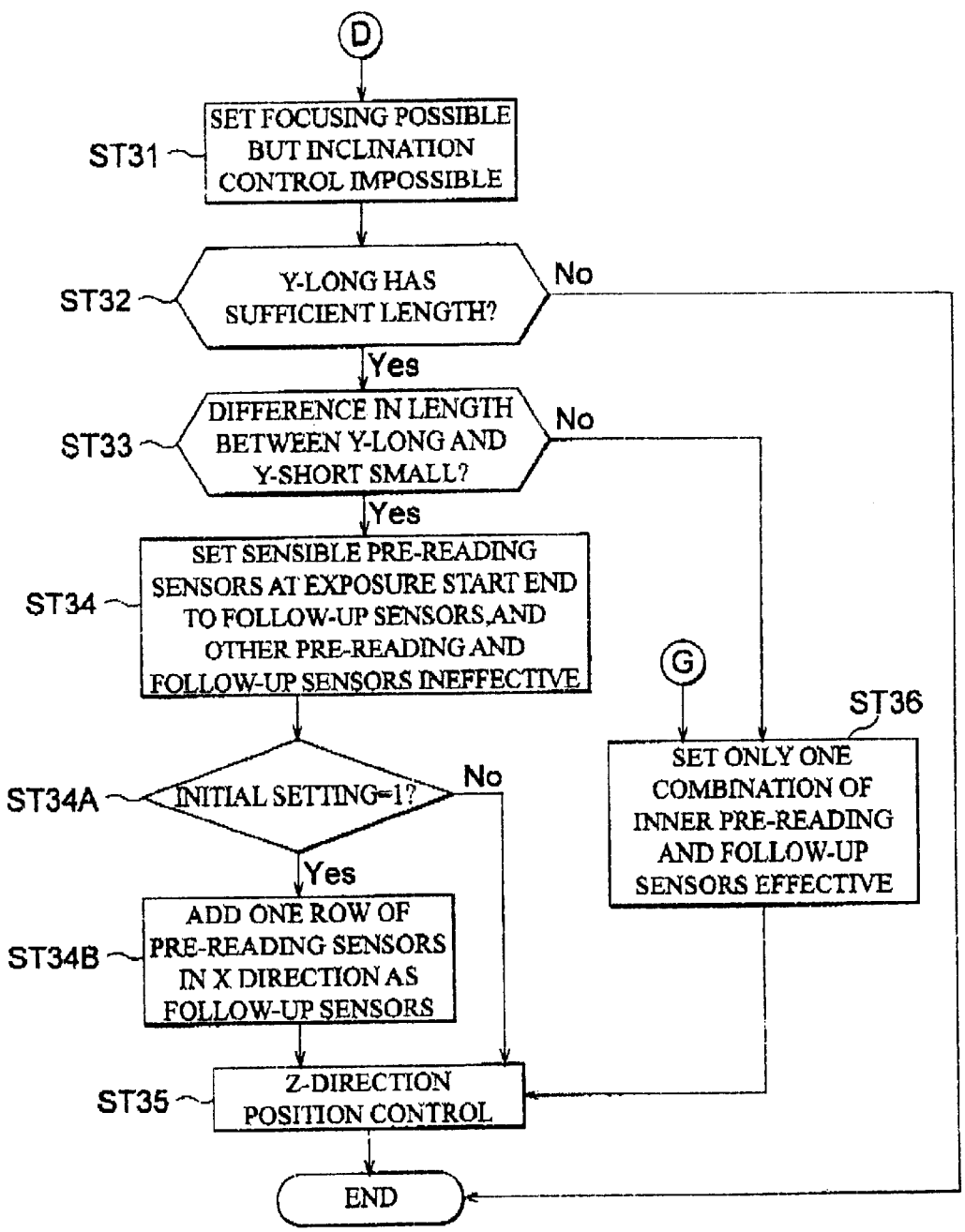
FIG. 7 is a (second) flowchart for explaining the first embodiment according to the present invention.

If it is judged at step ST22 that there are no sensible follow-up sensors, then the flow proceeds to step ST31 in FIG. 7, where it is set such that focusing is possible but inclination control is impossible. Here, it is judged whether or not there is an instant at which focusing is possible within the exposure area of the shot. If there is a possible instant, then this instant is used for exposure. The exposure of a marginal area of the wafer W is often carried out according to a demand for achieving exposure as favorable as possible, rather than utilizing this shot area as a product (which can be effected, though), in order to accomplish complete exposure of its adjacent shot areas. Hence, this process is based on the idea of exposing exposable areas as much as possible.

Subsequently, the flow proceeds to step ST32, where two sides of the exposure area in Y direction are calculated, and it is judged whether or not there is a length sufficient for focusing on the longer side. Here, the longer side and shorter side are referred to as Y-long and Y-short, respectively.

When the Y-long does not have a length sufficient for focusing, all the sensors are unusable. Since neither the inclination control not the position control in Z direction can be effected, no focusing is performed. Even in this case, however, exposure is carried out according to the above-mentioned idea of exposing as much as possible, and then this routine is terminated.

If the Y-long is judged to have a length sufficient for focusing, it can be seen that there is a sensor capable of focusing during exposure at any rate, whereby the flow proceeds to step ST33. Here, the length of Y-long and that of Y-short are compared with each other. If there is no much difference, i.e., the form of the focusable area is substantially quadrangular, then the flow proceeds to step ST34. Here, only the sensors in one lateral row (X direction) are made effective. In this embodiment, the pre-reading sensors capable of focusing at the exposure area start end are set to follow-up sensors, and the pre-reading sensors and follow-up sensors incapable of focusing are set ineffective, whereby the sensors in one lateral row are made effective.

Subsequently, the flow proceeds to step ST34A. Here, it is judged whether the initial setting at step ST0 in FIG. 5 is "1" or not. If the judgment at step ST34A is positive, then the flow proceeds to step ST34B, where all the pre-reading sensors in one row within the width of the initially specified pre-reading sensors in X direction are set effective as follow-up sensors, and the flow subsequently proceeds to step ST35. If the judgment at step ST34A is negative, the flow proceeds to step ST35 without increasing the number of effective sensors.

After such setting, the effective sensors are used for focusing, and exposure is carried out with the position control of the wafer W along Z direction (step ST35).

If it is judged that a large difference in length exists between Y-long and Y-short at step ST33, then it is determined that the exposure area of this shot is substantially triangular, and the flow proceeds to step ST36, where only one combination of the pre-reading and follow-up sensors located on the inner side of the wafer W is set effective.

Then, the flow proceeds to step ST35, where the effective sensors are used for focusing, and exposure is carried out after the position control in Z direction is effected.

Thereafter, subsequent to such processes as development, etching, and doping, resist is applied with a coater developer, and then exposure is effected. A series of these operations are repeated to produce semiconductor devices.

Figure 8:
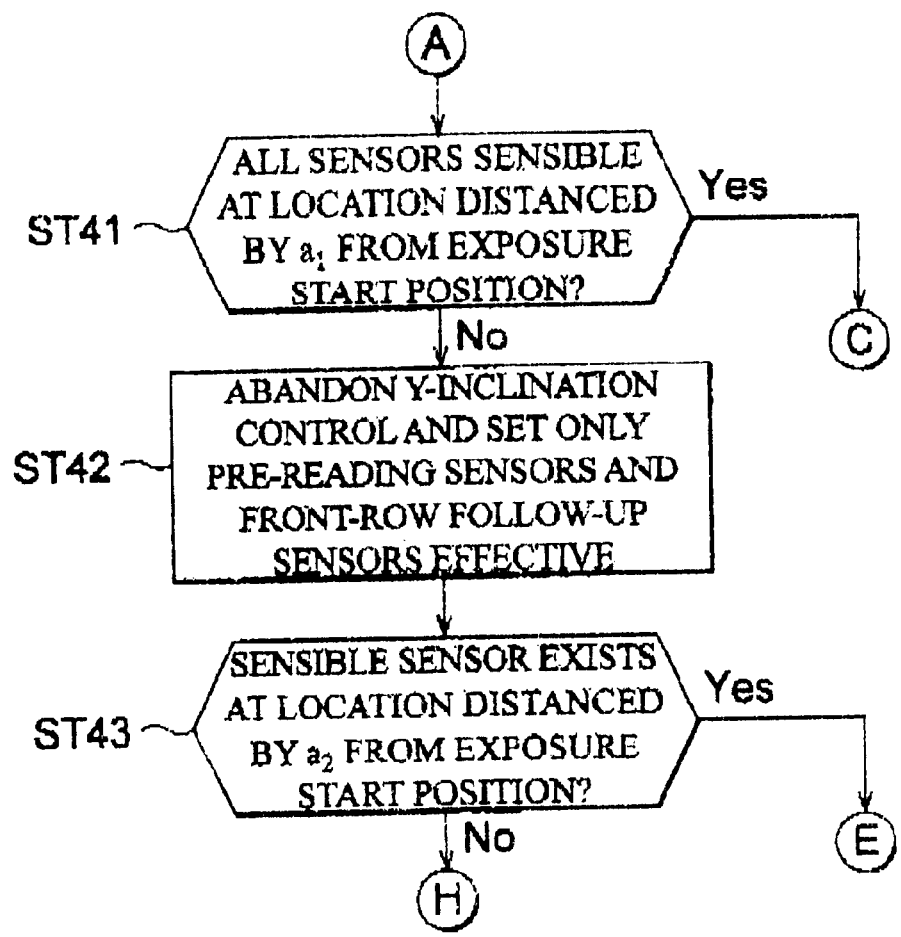
FIG. 8 is a (third) flowchart for explaining the first embodiment according to the present invention.

Meanwhile, if the negative judgment is made at step ST2 in FIG. 5, i.e., the case of scanning from the outside to inside of the wafer W surface, then the flow proceeds to step ST41 (FIG. 8). This step ST 41 is a step for judging whether the inclination control in Y direction is possible or not. In other words, it is judged whether or not focusing is possible (sensor is sensible) at a position distanced by a minimum approach length which enables the inclination control in Y direction.

In this embodiment, it is judged at step ST41 whether or not all the follow-up sensors initially specified are sensible in a state where the follow-up sensors in the front row and the exposure start position in the exposure area are separated from each other by $a_1$. If the judgment is positive here, then the flow proceeds to step ST13 (FIG. 5), where the wafer W is subjected to the X- and Y-tilting (inclination) and the position control in Z direction. Here, the distance $a_1$ is a length, based on the follow-up sensors in the front row (the follow-up sensors in the front row in the scanning from the outside to inside of the wafer W surface), which is necessary for the inclination control in Y direction and is determined according to each sensor-to-sensor distance, the response speed of the exposure apparatus, and the like.

If the judgment at step. ST41 is negative, i.e., it is judged that at least one insensible sensor exists, then the inclination control in Y direction is abandoned, and it is judged whether the inclination control in X direction is possible or not. To this end, it is judged whether or not focusing is possible at a position nearer by the approach length minimally required for the X-direction inclination control. Here, since the Y-direction inclination control is abandoned, it is meaningless to use a number of sensors in Y direction. Hence, only the pre-reading sensors and the follow-up sensors in the front row are set effective (step ST42). Then, the flow proceeds to step ST43.

At step ST43, it is judged whether or not there is a sensible sensor, among the follow-up sensors selected by the preceding processing, in a state where the follow-up sensors in the front row and the exposure start position are separated from each other by $a_2$. In the scanning from the outside to inside, the follow-up sensors are located on the outer side of the wafer W surface than are the pre-reading sensors. Consequently, as long as it is assured that the follow-up sensors are sensible, the pre-reading sensors can also be assumed sensible. Hence, it is sufficient if only the follow-up sensors are subjected to judgment here.

Here, the distance $a_2$ is a length based on the follow-up sensors in the front row (the follow-up sensors in the front row in the scanning from the outside to inside of the wafer W surface) which is necessary for the inclination control in X direction and is determined according to each sensor-to-sensor distance, the response speed of the exposure apparatus, and the like. (Whether the judging position is based on the distance $a_1$ or $a_2$ does not depend on the sensor-adding algorithm but for which judgment the processing is effected (whether the inclination control in X direction or the inclination control in XY directions).)

If the judgment at step ST43 is positive, i.e., it is judged that a sensible follow-up sensor exists at a position distanced by $a_2$, the flow proceeds to step ST23 (FIG. 6). At step ST23 and later, as explained with reference to FIG. 6, it is judged whether the X-direction inclination control is possible or not and, according to the result of this judgment, both X-direction inclination control and Z-direction position control or only the Z-direction position control is carried out.

Figure 9:
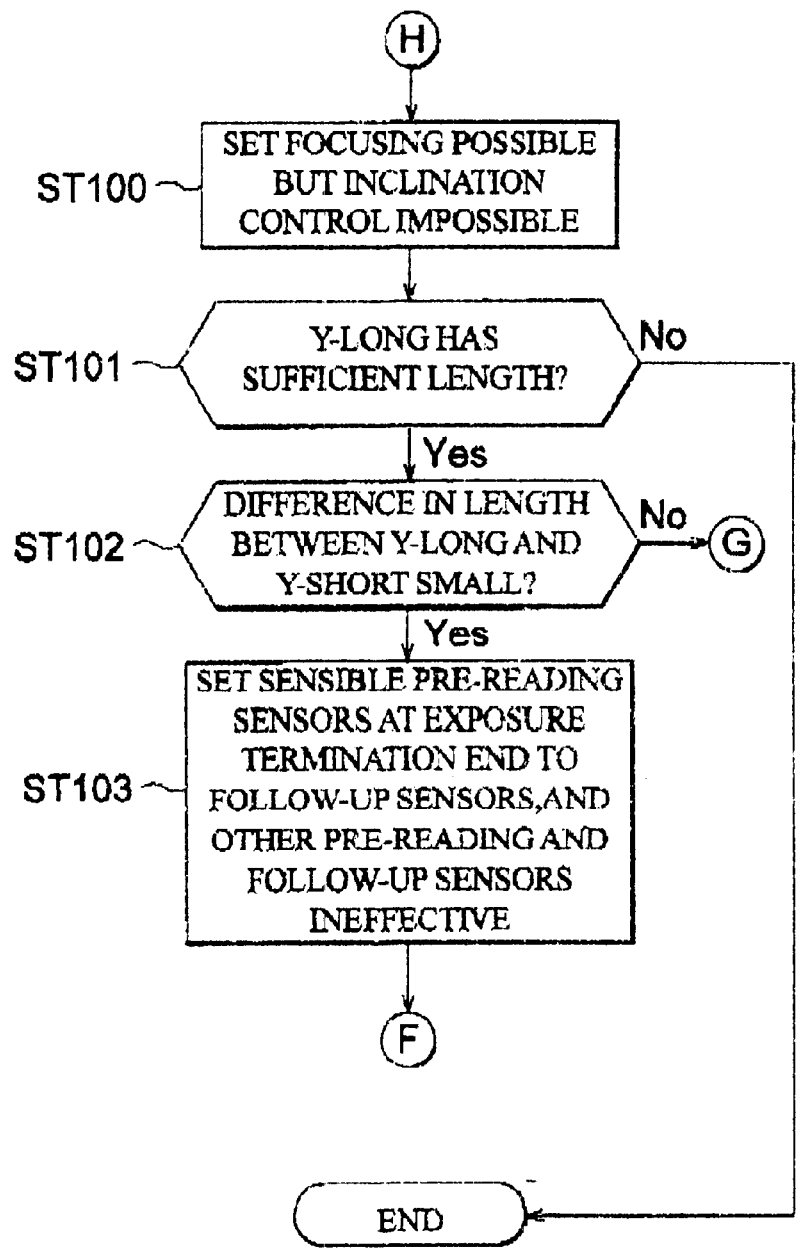
FIG. 9 is a (fourth) flowchart for explaining the first embodiment according to the present invention.

If the judgment at step ST43 is negative, i.e., it is judged that no sensible follow-up sensor exists at the position distanced by $a_2$, then the flow proceeds to step ST100 (FIG. 9).

If it is judged at step ST43 that no sensible sensor exists, then the flow proceeds to step ST100 in FIG. 9, where it is set such that focus tracking is possible but inclination control is impossible. Here, it is judged whether or not there is an instant at which focusing is possible within the exposure area of the shot. If there is a possible instant, then this instant is used for exposure. As with the case of step ST31 in FIG. 7, the exposure of a marginal area of the wafer W is often carried out according to a demand for achieving exposure as favorable as possible, rather than utilizing this shot area as a product (which can be effected, though), in order to accomplish complete exposure of its adjacent shot area. Hence, this process is based on the idea of exposing exposable areas as much as possible.

Subsequently, the flow proceeds to step ST101, where two sides of the exposure area in Y direction are calculated, and it is judged whether or not there is a length sufficient for focusing on the longer side. Here, the longer side and shorter side are referred to as Y-long and Y-short, respectively.

When the Y-long does not have a length sufficient for focusing, all the sensors are unusable. Since neither the inclination control nor the position control in Z direction can be effected, no focusing is performed. Even in this case, exposure is carried out according to the above-mentioned idea of exposing as much as possible, and then this routine is terminated.

If the Y-long is judged to have a length sufficient for focusing, it can be seen that there is a sensor capable of focusing during exposure at any rate, whereby the flow proceeds to step ST102. Here, the length of Y-long and that of Y-short are compared with each other. If there is no much difference, i.e., the form of the focusable area can be considered substantially quadrangular, then the flow proceeds to step ST103. Here, only the sensors in one lateral row (X direction) are made effective. In this embodiment, at the exposure area termination end, the pre-reading sensors capable of focusing are set to follow-up sensors, and the pre-reading sensors and follow-up sensors incapable of focusing are set ineffective, whereby only the sensors in one lateral row are made effective.

Subsequently, the flow proceeds to step ST34A in FIG. 7. At step ST34A and later, as explained with reference to FIG. 7, if the initial setting is "1" then the flow proceeds to step ST34B, where the number of sensors is increased, and further to step ST35. If the initial setting is not "1" then the flow proceeds to step ST35 without increasing the number of sensors.

After such setting, the effective sensors are used for focusing, and exposure is carried out with the position control of the wafer W along Z direction (step ST35).

If it is judged that a large difference in length exists between Y-long and Y-short at step ST102, then it is determined that the exposure area of this shot is substantially triangular, and the flow proceeds to step ST36 (FIG. 7), where only one combination (one column) of the pre-reading and follow-up sensors located on the inner side of the wafer W (nearer to the center thereof) is set effective.

Then, the flow proceeds to step ST35, where the effective sensors are used for focusing, and exposure is carried out after the position control in Z direction is effected.

Thereafter, subsequent to such processes as development, etching, and doping, resist is applied with a coater developer, and then exposure is effected. A series of these operations are repeated to produce semiconductor devices.

In the following, a specific example of focusing/leveling control in conformity to the flowcharts of FIGS. 5 to 9 described above will be explained with reference to FIGS. 10 to 21 as well. In each of the following drawings, blackened circular spots indicating sensors refer to pre-reading sensors, whereas whitened circular spots indicating sensors refer to follow-up sensors. Also, in each drawing, the wafer W is represented by its portion necessary for indicating the relationship between the shot area and a marginal portion including an edge, while the other portion is omitted with break lines. In the following specific example, it is assumed that the sensors $S_{12}$, $S_{15}$, and $S_{16}$ are specified as the pre-reading sensor 102a, the sensors $S_{22}$, $S_{25}$, and $S_{28}$ as the follow-up sensor 103a, the sensor $S_{15}$ as the follow-up sensor 103b, the sensors $S_{42}$, $S_{45}$, and $S_{46}$ as the follow-up sensor S103c, and the sensors $S_{52}$, $S_{55}$, and $S_{5a}$ as the pre-reading sensor 102b at step ST0 in FIG. 5. While the numerals indicating the sensors in FIG. 10 and later are normal characters attached to S such as S12, for example, they correspond to subscripts attached to S in FIG. 3 such as $S_{12}$, for example. Further, the arrow D1 indicates the scanning direction from the inside to outside of the wafer W surface, whereas the arrow D2 indicates the scanning direction from the outside to inside of the wafer W surface.

In a shot area scanned from the inside to outside of the wafer W surface, it is important whether focusing is possible or not, i.e., detection by sensors is possible or not, at the time of terminating exposure rather than at the time of starting exposure. If focusing is possible at the time of terminating exposure, the focusing is possible at the starting point, which is located on the inner side of the wafer W surface, as a matter of course.

Figure 10:
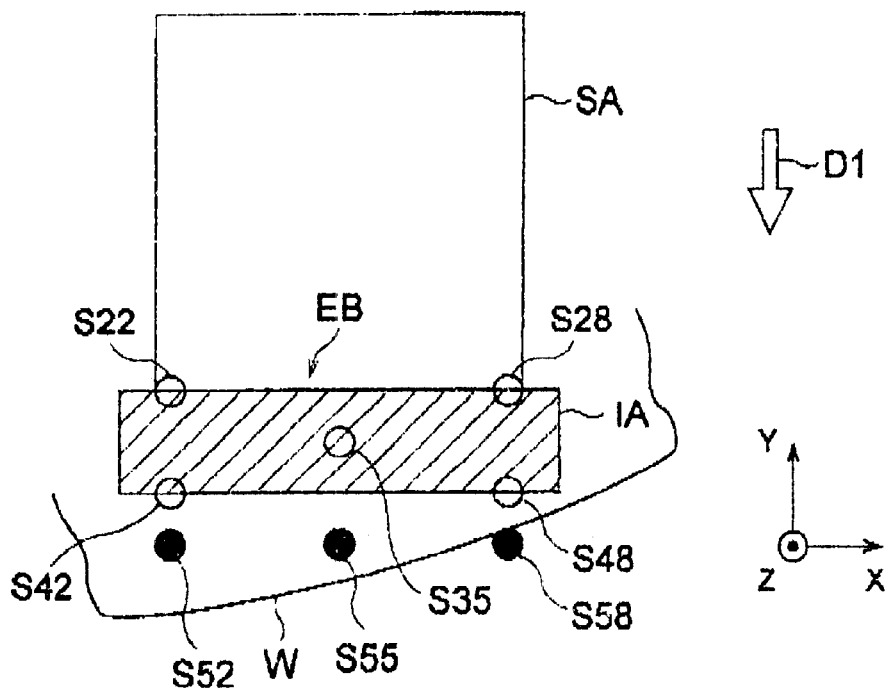
FIG. 10 is a (first) view for explaining, in the first embodiment according to the present invention, a scanning operation directed from the inside to outside of the substrate in terms of the relationship between exposure area and arrangement of sensors.

Successively disposed in FIG. 10 are three pieces of equally spaced pre-reading sensors ($S_{52}$, $S_{55}$, and $S_{58}$) in a single row in X direction; two pieces of the first-row follow-up sensors ($S_{42}$ and $S_{48}$) in the row immediately after pre-reading sensors, respectively aligning with both ends of the above-mentioned three pieces of the pre-reading sensors; one piece of the second-row follow-up sensor ($S_{35}$) aligning with the center sensor in the three pieces of pre-reading sensors; and two pieces of the third-row follow-up sensors ($S_{22}$ and $S_{28}$) in the same arrangement as the first-row follow-up sensors. Namely, five pieces in total comprising one row of three pieces of pre-reading sensors and three rows of follow-up sensors are arranged with the same row spacing. Here, alignments in X and Y directions are referred to as row and column, respectively. The illumination area IA of the slit covers the region between the first-row follow-up sensors and the third-row follow-up sensors.

At step ST3 in FIG. 5, it is judged whether or not exposure is possible with the specified sensors in conformity to the setting at the time of terminating exposure. Here, it is judged whether or not all the follow-up sensors are sensible, in other words, whether or not all the follow-up sensors are located within the effective area of the wafer W. Even if the pre-reading sensors are located in the area incapable of focusing, i.e., outside the effective area of the wafer W, only the pre-reading sensors fail to function, whereas the follow-up sensors keep functioning, thus allowing the focusing to be effected normally.

In the case shown in FIG. 10, when, of the specified follow-up sensors, the last, third-row follow-up sensors ($S_{22}$ and $S_{28}$) reach the exposure end position EB, which is a side of the exposure area SA in X direction, all the follow-up sensors from the first to third row are located within the effective area of the wafer W and thus are sensible, whereby the flow can proceed to the next step ST13 shown in FIG. 5. Here, of the three pieces of pre-reading sensors, the sensor $S_{58}$ at the right end is located outside the effective area. Nevertheless, as mentioned above, since the follow-up sensors are capable of focusing independently of the pre-reading sensors even when the latter become incapable of focus control, there would be no problems.

Figure 11:
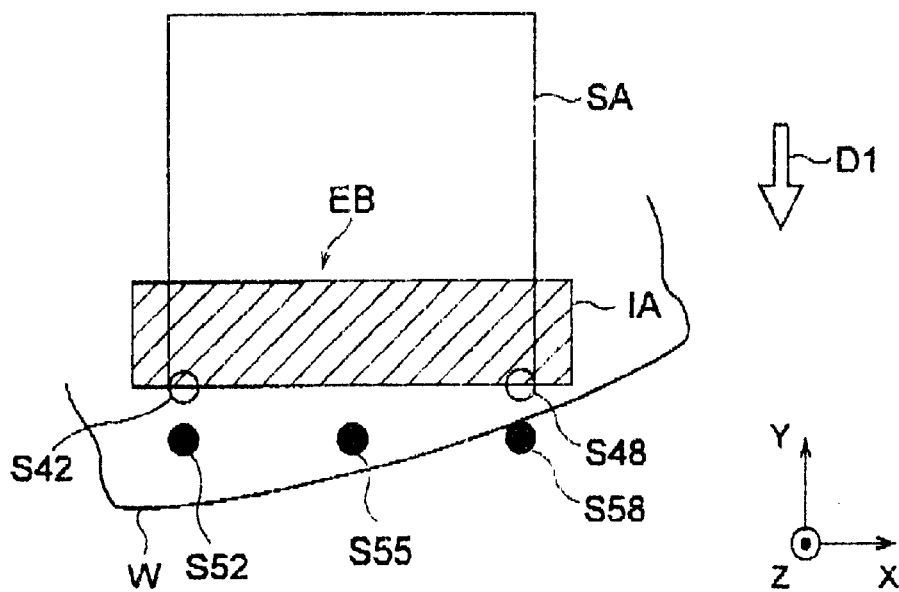
FIG. 11 is a (second) view for explaining, in the first embodiment according to the present invention, a scanning operation directed from the inside to outside of the substrate in terms of the relationship between exposure area and arrangement of sensors.

FIG. 11 shows the state where, when the judgment at step ST3 is negative, i.e., when the selected follow-up sensors include one that is incapable of focusing (e.g., where it is judged whether or not the follow-up sensors such as that shown in FIG. 10 can detect the exposure area SA in a positional relationship such as that shown in FIG. 11), the flow proceeds to step ST21, where only the pre-reading sensors and the front-row follow-up sensors are made effective. Thereafter, the flow proceeds to step ST22 in FIG. 6.

FIG. 11 shows the state where the judgment at step ST3 in FIG. 5 is negative, and sensors are selected at step ST21 in FIG. 6.

In the example of FIG. 11, when the front-row follow-up sensors ($S_{42}$ and $S_{45}$) are located at the exposure end position EB, it is judged whether at least one sensible follow-up sensor exists or not (step ST22). Namely, at the judging position, it is judged whether or not the front-row follow-up sensors ($S_{42}$ and $S_{48}$) are located within the effective area of the wafer W. FIG. 11 shows the state where the front-row follow-up sensors ($S_{42}$ and $S_{48}$) are sensible when located at the exposure end position EB. Consequently, the judgment at step ST22 is made positive, and the flow proceeds to step ST23.

In the case where the initial setting is set to "2" (no increase of sensors) at step ST0 in FIG. 5, in the example of FIG. 11, the combination of the follow-up sensor $S_{42}$ judged to be effective and the pre-reading sensor $S_{52}$ and the combination of the follow-up sensor $S_{48}$ judged to be effective and the pre-reading sensor $S_{58}$ are set effective as usable sensors.

Figure 12:
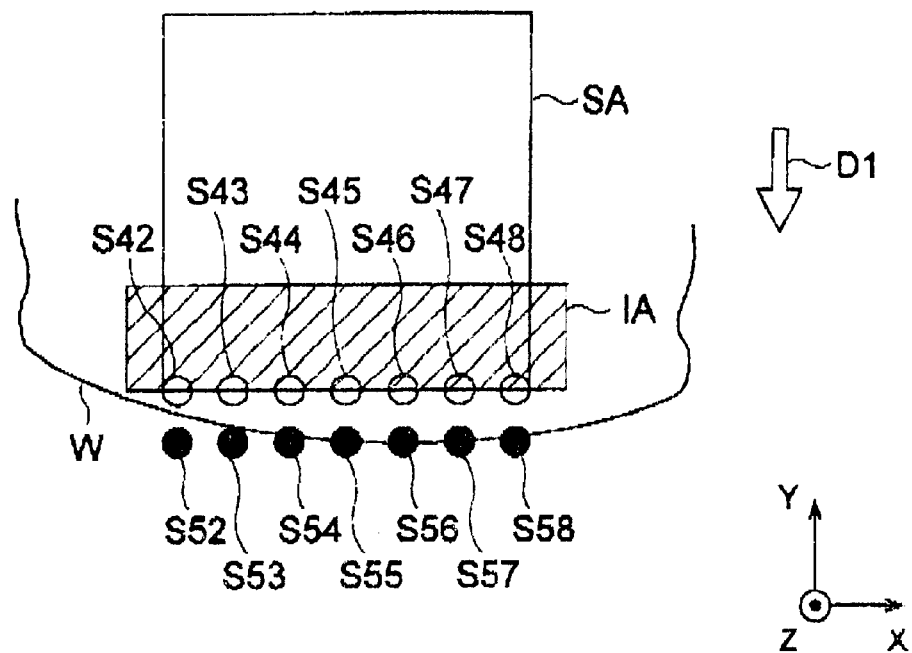
FIG. 12 is a (third) view for explaining, in the first embodiment according to the present invention, a scanning operation directed from the inside to outside of the substrate in terms of the relationship between exposure area and arrangement of sensors.

The case where the initial setting is set to "1" (increase of sensors) at step ST0 in FIG. 5 will be explained with reference to FIG. 12. In FIG. 12, within the width of the specified follow-up sensors ($S_{42}$ and $S_{48}$) in X direction, the other sensible follow-up sensors ($S_{43}$, $S_{44}$, $S_{45}$, $S_{46}$, and $S_{47}$) are set effective, thus increasing the number of sensors. Also, the pre-reading sensors ($S_{52}$, $S_{53}$, $S_{54}$, $S_{55}$, $S_{56}$, $S_{57}$, and $S_{58}$) respectively aligning with the sensible follow-up sensors in the identical columns are set effective. Consequently, each combination (for every identical column) of pre-reading sensor (from $S_{52}$ to $S_{5a}$) and follow-up sensor (from $S_{42}$ to $S_{48}$) is set effective.

FIG. 12 shows an example in which the specified follow-up sensors ($S_{42}$ and $S_{46}$) located at both ends are sensible. Nevertheless, in the case where the initial setting is set to "1" when only the specified follow-up sensor $S_{40}$ is sensible, for example, of the remaining follow-up sensors (from $S_{42}$ to $S_{47}$) within the width of the follow-up sensors $S_{42}$ and $S_{45}$ in X direction, it is sufficient if sensible follow-up sensors and the pre-reading sensors paired therewith are set effective. Namely, when the initial setting is specified as "1" in the case of FIG. 12, the sequence for increasing the number of sensors within the width of specified follow-up sensors in X direction is employed.

Which follow-up sensors are sensible is determined depending on the positional relationship between the shot SA and the wafer edge and the positional relationship between the follow-up sensors and the effective area of the wafer at the judging position, and can be judged by the main control unit 20 according to the wafer edge coordinates and shot map stored in the memory 200 as well as the sensor arrangement information and sensor designation information.

If the judgment at step ST22 in FIG. 6 is negative, then the inclination control is judged to be impossible, and the flow proceeds to step ST31, where the lengths of the right and left sides of the exposure area are compared with each other.

Figure 13:
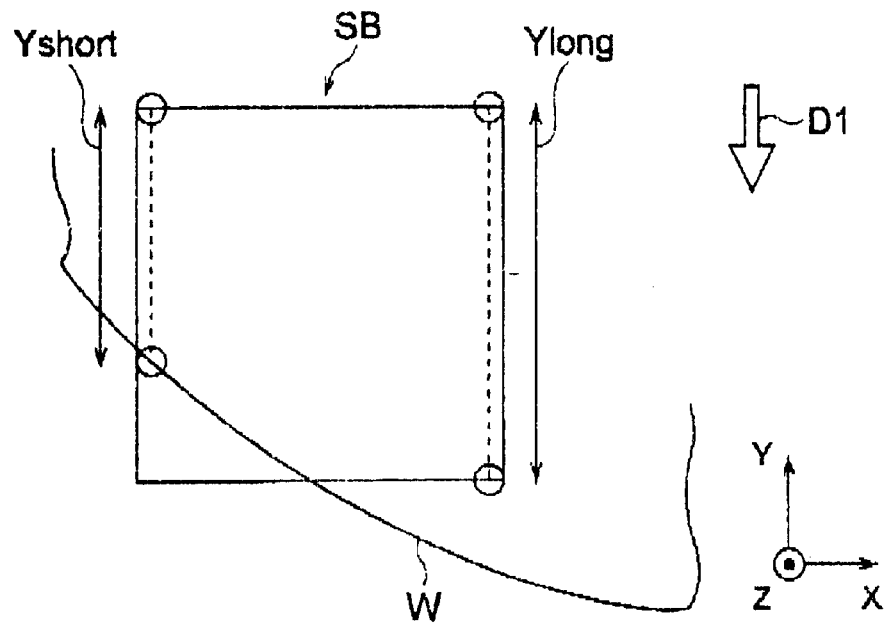
FIG. 13 is a (fourth) view for explaining in the first embodiment according to the present invention, a scanning operation directed from the inside to outside of the substrate in terms of the relationship between exposure area and arrangement of sensors.

FIG. 13 shows an example of the state in which the lengths of the right and left sides of the exposure area (lengths of sides in Y direction) are compared with each other. In this drawing, since the right side that is the inner side of the wafer W is longer than the left side, the right side is referred to as Y-long.

Figure 14:
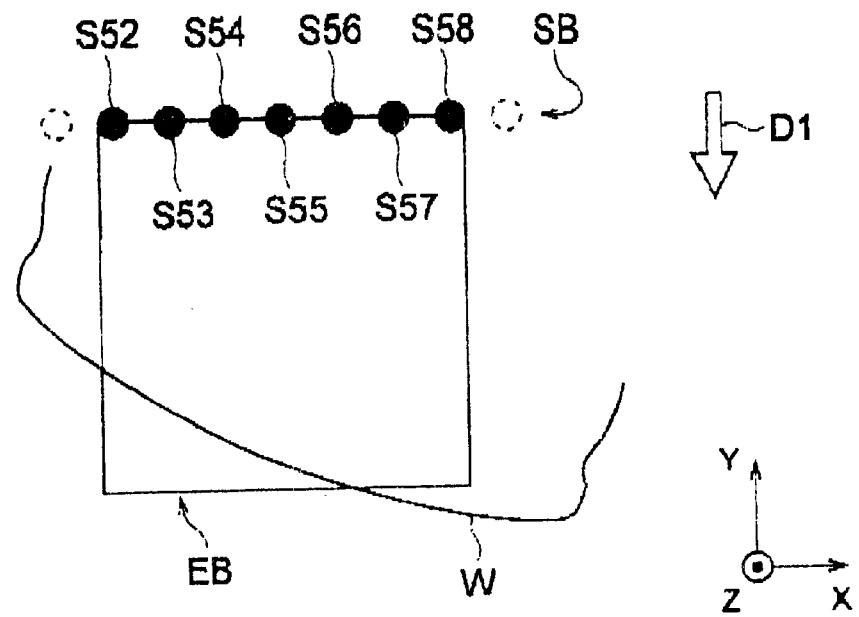
FIG. 14 is a (fifth) view for explaining, in the first embodiment according to the present invention, a scanning operation directed from the inside to outside of the substrate in terms of the relationship between exposure area and arrangement of sensors.

FIG. 14 shows an example of the case where the difference in length between the right and left sides is judged to be small at step ST33. It is the case where the difference in length between the Y-long and Y-short is not large, i.e., the form of the area capable of focusing can be considered substantially quadrangular. Here, as explained in conjunction with steps ST34, ST34A, and ST34B, only one lateral row of the sensible pre-reading sensors are made effective at the exposure start position SB. In the example of FIG. 14, the judgment at step ST34A is made positive, and one lateral row of the pre-reading sensors ($S_{52}$ to $S_{5e}$) are set to follow-up sensors at step ST34B, whereby the number of sensors is increased from that of the specified sensors ($S_{52}$, $S_{55}$, and $S_{58}$).

Figure 15:
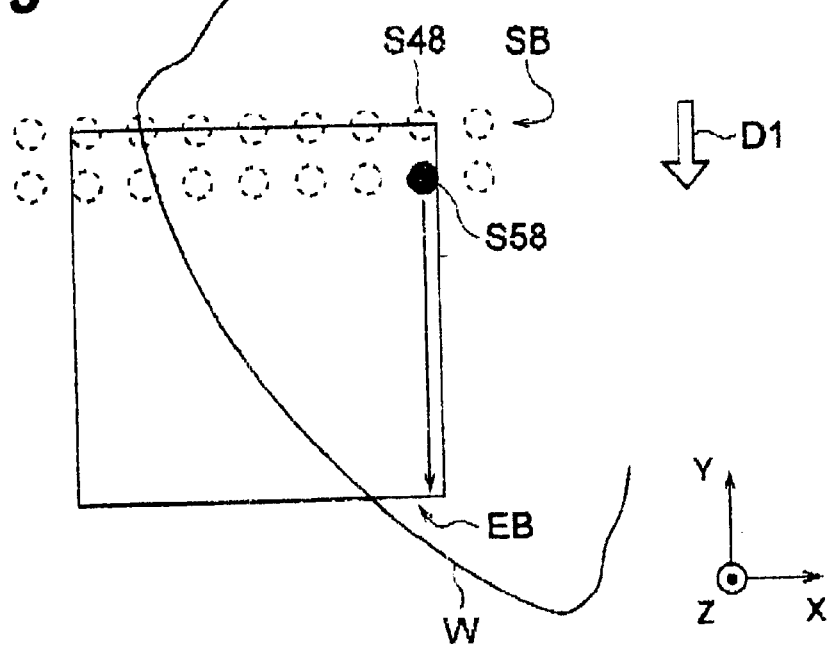
FIG. 15 is a (sixth) view for explaining, in the first embodiment according to the present invention, a scanning operation directed from the inside to outside of the substrate in terms of the relationship between exposure area and arrangement of sensors.

FIG. 15 shows an example of the case where the difference in length between the right and left sides is judged to be large at step ST33. The Y-short, which is the left side in the drawing, is zero, whereas the Y-long, which is the right side, leaves the whole length thereof, thereby yielding a large difference in length between the Y-long and Y-short. Consequently, the exposure area of this shot is judged to be substantially triangular. Also, as explained at step ST36 (FIG. 7), only one combination of the pre-reading sensor ($S_{5B}$) on the inner side of the wafer W surface and the follow-up sensor ($S_{48}$) is set effective.

At step ST21 (FIG. 6), as shown in FIG. 11, only the pre-reading sensors and the front-row follow-up sensors are made effective. As a consequence, when the slit region further advances from the state shown in FIG. 11, such that the last line of the slit reaches the exposure end position EB of the exposure area SA, the effective first-row follow-up sensors may be located outside the effective area of the wafer W, thereby yielding a possibility of the slit portion being defocused. Nevertheless, the exposure of a marginal area of the wafer W is often carried out according to a demand for achieving exposure as favorable as possible, rather than utilizing this shot area as a product (which can be effected, though), in order to accomplish complete exposure of its adjacent shot areas. Hence, even when there is some defocusing at the time of terminating exposure, there will be no problem is substantially the whole area is in focus.

In place of the configuration shown in FIG. 11, the last, third-row follow-up sensors may be made usable. In this case, the follow-up sensors do not detect the exposure area SA at the time of starting exposure but still detect this area at the time of terminating exposure.

Also, without the setting at step ST21, the judgment at step ST22 may be effected with the front-row follow-up sensors, and all the combinations of usable follow-up and pre-reading sensors may be set effective at step ST23.

In the foregoing examples, depending on the shot area, there are cases where both or one of Y-inclination control and X-inclination control cannot be effected. In such a case, the inclination information in the shot area immediately prior to the exposure area may be stored in the main control unit, and the inclination control in the uncontrollable direction may be effected by use of this information.

Figure 16:
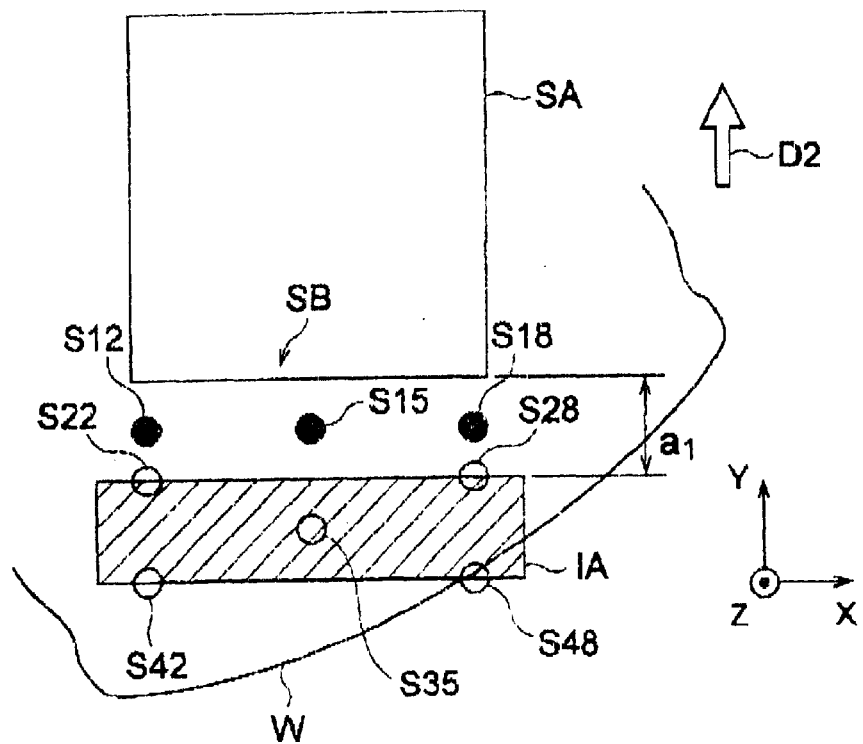
FIG. 16 is a (first) view for explaining, in the first embodiment according to the present invention, a scanning operation directed from the outside to inside of the substrate in terms of the relationship between exposure area and arrangement of sensors.

FIG. 16 shows a typical positional relationship between the wafer and sensors in the case where the judgment at step ST2 is negative, i.e., the case where the wafer surface is scanned from the outside to inside, whereby the flow proceeds to step ST41. At step ST41, as explained above, it is judged whether or not, of the specified follow-up sensors, at least one insensible sensor exists in the state (at the judging position) where the front-row follow-up sensors ($S_{22}$ and $S_{28}$) and the exposure start position of the exposure area are separated from each other by $a_1$. In FIG. 16, of the specified follow-up sensors, the follow-up sensor ($S_{48}$) at the right end is located outside the effective area. As a consequence, the judgment at step ST41 is made negative, and the flow proceeds to the next step ST42 (FIG. 8).

Figure 17:
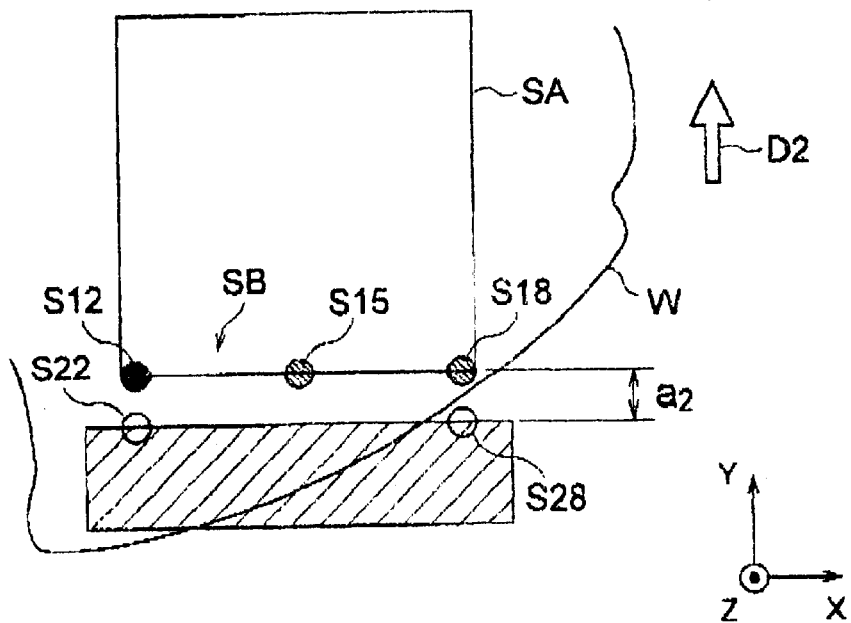
FIG. 17 is a (second) view for explaining, in the first embodiment according to the present invention, a scanning operation directed from the outside to inside of the substrate in terms of the relationship between exposure area and arrangement of sensors.

FIG. 17 shows a typical positional relationship between the wafer and sensors in the case where the inclination control in Y direction is abandoned, only the pre-reading sensors ($S_{12}$, $S_{15}$, and $S_{18}$) and the front-row follow-up sensors ($S_{22}$ and $S_{28}$) are made effective (step ST42), and it is judged whether or not, of the follow-up sensors specified in the preceding processing (at step ST42), sensible sensors exist in the state (at the judging position) where the front-row follow-up sensors and the exposure start position of the exposure area are separated from each other by $a_1$. In FIG. 17, of the follow-up sensors set effective, one sensor ($S_{22}$) at the left end is located within the effective area of the wafer W. Consequently, the judgment at step ST43 is made positive, and the flow proceeds to the next step ST23 (FIGS. 8 and 6).

In the case where the initial setting is set to "2" (no increase of sensors) at step ST0 in FIG. 5, of the sensors set at step ST42, those usable are set effective at step ST23. Hence, in the example of FIG. 17, only the combination of the follow-up sensor $S_{22}$ and pre-reading sensor $S_{12}$ judged to be effective is set as usable sensors.

Thus set follow-up sensor $S_{22}$ and pre-reading sensor $S_{12}$, however, are located in the same column and do not have a spacing therebetween sufficient for effecting the inclination control in X direction in the example of FIG. 17. Consequently, in the example of FIG. 17, the judgment at the next step ST24 is made negative, whereby the flow proceeds to step ST26, thus allowing only the position control in Z direction to be carried out.

Figure 18:
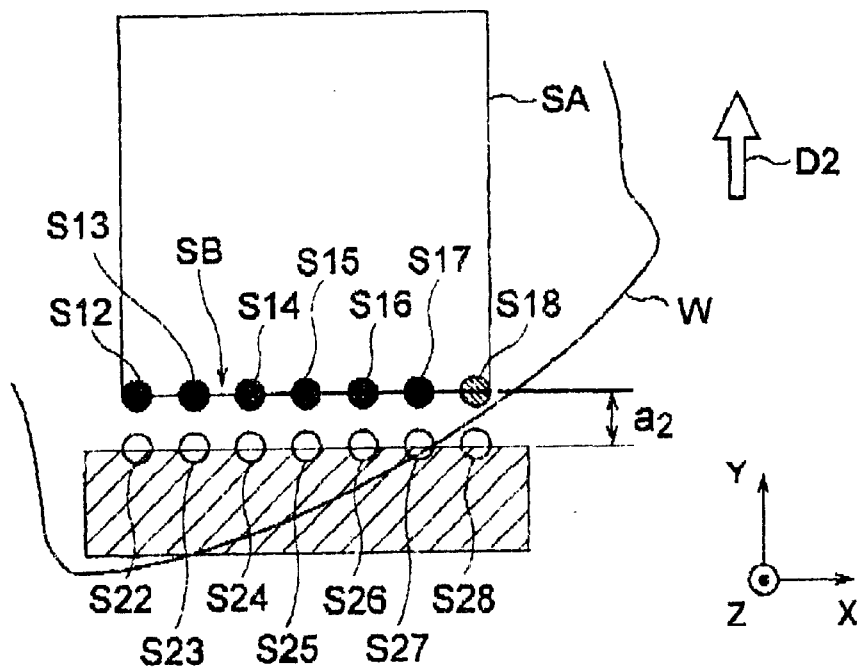
FIG. 18 is a (third) view for explaining, in the first embodiment according to the present invention, a scanning operation directed from the outside to inside of the substrate in terms of the relationship between exposure area and arrangement of sensors.

The case where the initial setting is set to "1" (increase of sensors) at step ST0 in FIG. 5 will be explained with reference to FIG. 18. In FIG. 18, the follow-up sensors $S_{23}$ to $S_{27}$ are added as sensible sensors within the width between the sensors ($S_{22}$ and $S_{28}$) at both ends concerning the specified sensors in X direction. Also, the pre-reading sensors ($S_{12}$ to $S_{17}$) respectively aligned with the individual sensible follow-up sensors in the identical columns are set as sensible sensors. As a consequence, each combination (for every identical column) of the pre-reading sensor (from $S_{12}$ to $S_{17}$) and follow-up sensor (from $S_{22}$ to $S_{27}$) is set as sensible sensors.

Which follow-up sensors are sensible is determined depending on the positional relationship between the shot SA and the wafer edge and the positional relationship between the follow-up sensors and the effective area of the wafer at the judging position, and can be judged by the main control unit 20 according to the wafer edge coordinates and shot map stored in the memory 200 as well as the sensor arrangement information and sensor designation information.

If the judgment at step ST43 in FIG. 8 is negative, then the inclination control is judged to be impossible, and the flow proceeds to step ST100, where the lengths of the right and left sides (the sides extending along the scanning direction) of the exposure area are compared with each other.

Figure 19:
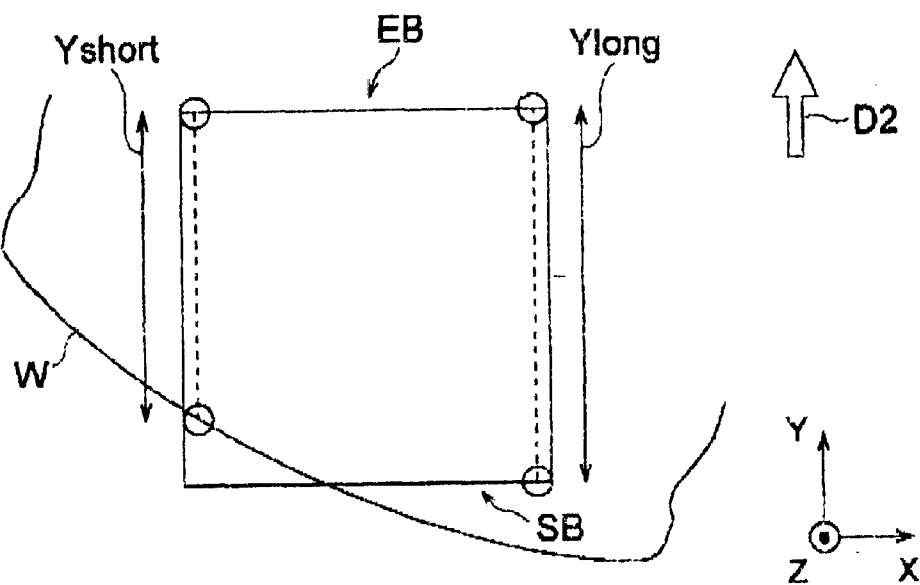
FIG. 19 is a (fourth) view for explaining, in the first embodiment according to the present invention, a scanning operation directed from the outside to inside of the substrate in terms of the relationship between exposure area and arrangement of sensors.

FIG. 19 is a view in the case of scanning from the outside to inside of the wafer surface along the arrow D2, corresponding to FIG. 13 in which the scanning is effected from the inside to outside of the wafer surface along the arrow D1. This case differs from that of FIG. 13 in that the exposure start position SB is on the marginal portion side of the wafer W. This drawing shows a typical positional relationship between the wafer W and sensors in the case where, after the setting at step ST100, the judgment at step ST101 is effected. In FIG. 19, of the sides in Y direction, the right side, which is longer, is referred to as Y-long, whereas the left side, which is shorter, is referred to as Y-short.

Figure 20:
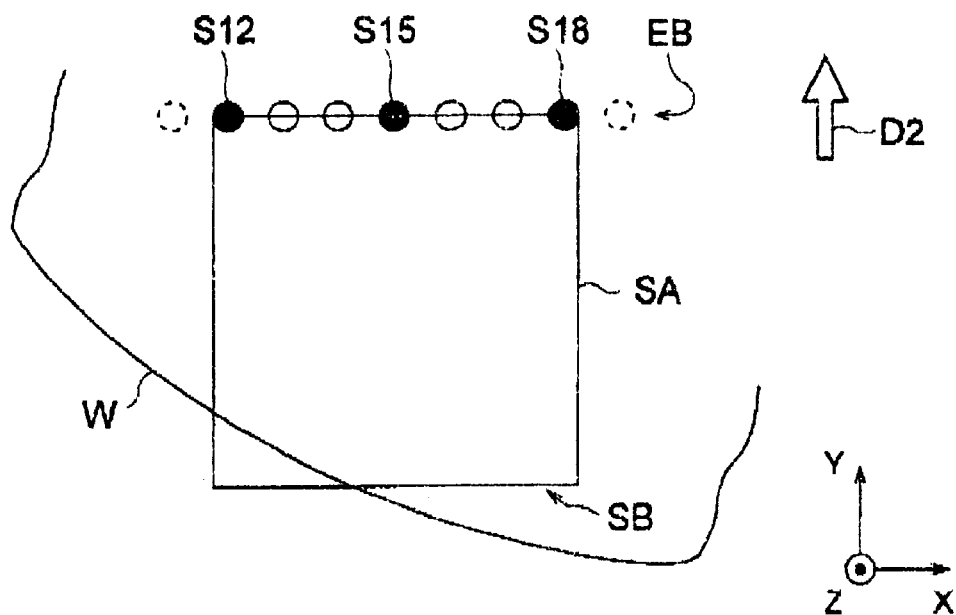
FIG. 20 is a (fifth) view for explaining, in the first embodiment according to the present invention, a scanning operation directed from the outside to inside of the substrate in terms of the relationship between exposure area and arrangement of sensors.

FIG. 20 is a view in the case of scanning from the outside to inside of the wafer surface along the arrow D2, corresponding to FIG. 14 in which the scanning is effected from the inside to outside of the wafer surface along the arrow D1. This case differs from that of FIG. 14 in that the exposure start position SB is on the marginal portion side of the wafer W. This drawing shows the state where the lengths of the Y-long and Y-short are compared with each other (step ST102), their difference is judged to be small, and only one lateral row (in X direction) of sensible sensors are made effective at the exposure end position EB (steps ST103, ST34A, and ST34B). In the example of FIG. 20, the judgment at step ST34A is made negative, and the specified pre-reading sensors ($S_{12}$, $S_{15}$, and $S_{18}$) are set as follow-up sensors.

Figure 21:
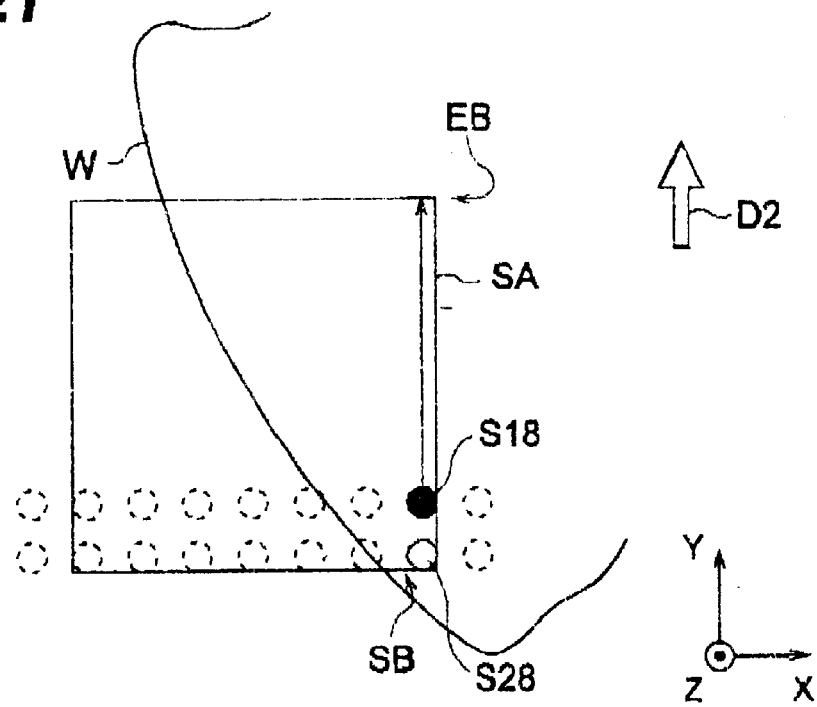
FIG. 21 is a (sixth) view for explaining, in the first embodiment according to the present invention, a scanning operation directed from the outside to inside of the substrate in terms of the relationship between exposure area and arrangement of sensors.

FIG. 21 is a view in the case of scanning from the outside to inside of the wafer surface along the arrow D2, corresponding to FIG. 15 in which the scanning is effected from the inside to outside of the wafer surface along the arrow D1. This case differs from that of FIG. 15 in that the exposure start position SB is on the marginal portion side of the wafer W. This drawing shows the case where the difference in length between the right and left sides is judged to be large at step ST102. Namely, the exposure area is judged to be substantially triangular, and only one combination of the pre-reading sensor ($S_{18}$) on the inner side of the wafer W and the follow-up sensor ($S_{28}$) is set effective (step ST36).

Though the explanations overlapping with those in the case of scanning from the inside to outside of the wafer surface are partly omitted, the present invention is also applicable to the case of scanning from the outside to inside of the wafer surface as explained here.

In the following, the second embodiment according to the present invention will be explained with reference to FIGS. 5 and 22 to 30. This embodiment is intended to carry out leveling and focusing as much as possible without abandoning them while using as many sensors as possible.

Figure 22:
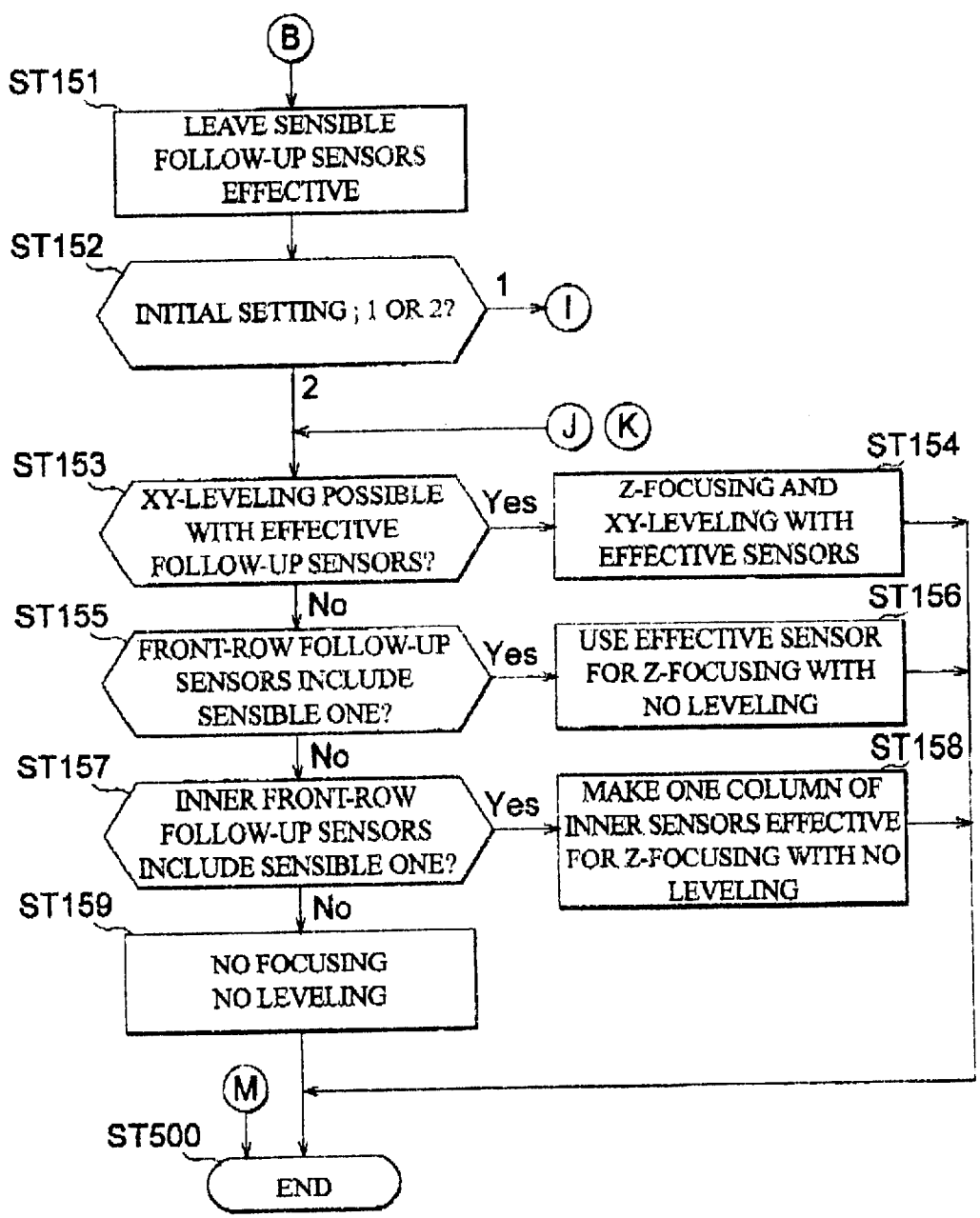
FIG. 22 in a flowchart for explaining, in the second embodiment according to the present invention, a scanning operation directed from the inside to outside of the substrate.

FIG. 22 is a flowchart for explaining the case of scanning from the inside to outside of the wafer surface in the second embodiment. In this embodiment, as with the first embodiment, XYZ control, i.e., normal auto-focusing/auto-leveling, is performed when the shot area is judged not to be a wafer marginal shot area, as shown in FIG. 5.

FIG. 22 shows the operations carried out after it is judged at step ST3 in FIG. 5 that, of the follow-up sensors in the usable state at the exposure end position in the shot area, there is at least one insensible sensor, i.e., sensor located outside the effective area of the wafer W, in the case of scanning from the inside to outside of the wafer surface.

In FIG. 22, at step ST151, of the follow-up sensors in a usable state at the time of judging at step ST3, those judged at step ST3 to be insensible are eliminated from the usable state, while the sensible sensors are left effective. Here, the follow-up sensors in the usable state are typically those specified by a user. For example, the user usually specifies, of the 45 pieces of sensors arranged as shown in FIG. 3, the leftmost, rightmost, and center sensors in the non-scanning direction of the shot in the front and last rows in the scanning direction as follow-up sensors. For example, in the case of FIG. 3, the sensors $S_{22}$, $S_{28}$, $S_{42}$, $S_{48}$, and $S_{38}$ are specified. As pre-reading sensors, those corresponding to thus specified follow-up sensors, i.e., sensors aligning therewith in the scanning direction, the sensors $S_{52}$, $S_{55}$, and $S_{58}$ (the pre-reading sensors in the scanning from the inside to outside of the wafer surface) (and the sensors $S_{12}$, $S_{15}$, and $S_{18}$ (the pre-reading sensors in the scanning from the outside to inside of the wafer surface) are specified in the case of FIG. 3. In this case, 8 pieces of sensors in total comprising 5 pieces of follow-up sensors and 3 pieces of pre-reading sensors with reference to the scanning direction from the inside to outside of the wafer surface are set into the usable state (the pre-reading sensors in the case of scanning from the outside to inside of the wafer surface being $S_{12}$, $S_{15}$, and $S_{16}$). The follow-up sensors in the usable state may be determined by other methods as well. For example, the sensors used in the immediately preceding process may be employed therefor.

Here, if automatic selection of sensors is permitted, i.e., the initial setting is 1, then the flow proceeds to step ST211 explained with reference to FIG. 26.

Depending on the user's process, there are cases where adding sensors other than those at the specified sensor positions (e.g., five pieces in total of follow-up sensors at the right and left in the front and rear and the center as mentioned above) may be inconvenient. In such a case, automatic selection of sensors is not set. If the automatic selection is not permitted, i.e., the initial setting is 2 (as it is judged at step ST152 whether the initial setting is 1 or 2), then it is judged (at step ST153) whether or not the sensors left effective at step ST151 are capable of leveling in X and Y directions (XY-leveling). It is determined according to whether or not the spacing between the sensible follow-up sensors in the front row is in a state sufficient for leveling in X direction (X-leveling) at the exposure end position. Since the scanning is directed from the inside to outside, if the front row is capable of X-leveling at the exposure end position, then the subsequent follow-up sensors on the inner side of the wafer are sensible as a matter of course, whereby leveling in Y direction (Y-leveling) is also possible. Consequently, if the judgment at step ST153 is positive, then the flow proceeds to step ST154, whereby effective sensors are used for carrying out focusing in Z direction (Z-focusing) and XY-leveling, i.e., normal auto-focusing/auto-leveling.

After step ST154, the flow proceeds to step ST500, whereby the setting of the sensors to be made effective for the shot is terminated. Then, the flow shifts to the setting of sensors to be made effective for the next shot, and similar steps are taken.

If the judgment is made negative at step ST153, i.e., the sensors made effective are not sufficient for X-leveling, then the flow proceeds to step ST155. At step ST155, it is judged whether or not the effective follow-up sensors in the front row include at least one sensible sensor at the exposure end position.

If the judgment at step ST155 is positive, there is at least one sensible follow-up sensor. Then, the flow proceeds to step ST156, whereby this sensor is used for carrying out Z-focusing, and the selection of sensors to be made effective is terminated (step ST500).

If the judgment at step ST155 is negative, then the flow proceeds to step ST157, where it is judged whether or not the sensors on the inner side, in particular, in the effective follow-up sensors in the front row are sensible. Even when the follow-up sensors in the front row include no sensible ones at the exposure end position, sensible sensors may exist at the exposure start position that is under a better condition. Hence, if the judgment is positive, then the flow proceeds to step ST158, whereby one column of sensors on the inner side are made effective, so as to carry out Z-focusing. Here, no leveling is performed. Then, this adjustment operation is terminated (step ST500).

Here, there must be cases where X-leveling is impossible but Y-leveling is possible depending on the arrangement of effective sensors. In general, however, it will be unpractical if leveling is effected only in Y direction, which is the scanning direction, without effecting leveling in X direction, which is a direction perpendicular to the scanning direction. Therefore, the case of performing Y-leveling without X-leveling will not be mentioned in the following explanation. Such a case should not be excluded from the scope of the present invention, however.

If the judgment at step ST157 is negative, neither focusing nor leveling is carried out (step ST159). Even in this case, however, exposure would be effected according to the idea of exposing as much as possible, as explained above. Then, this judgment operation is terminated (step ST500).

Figure 26:
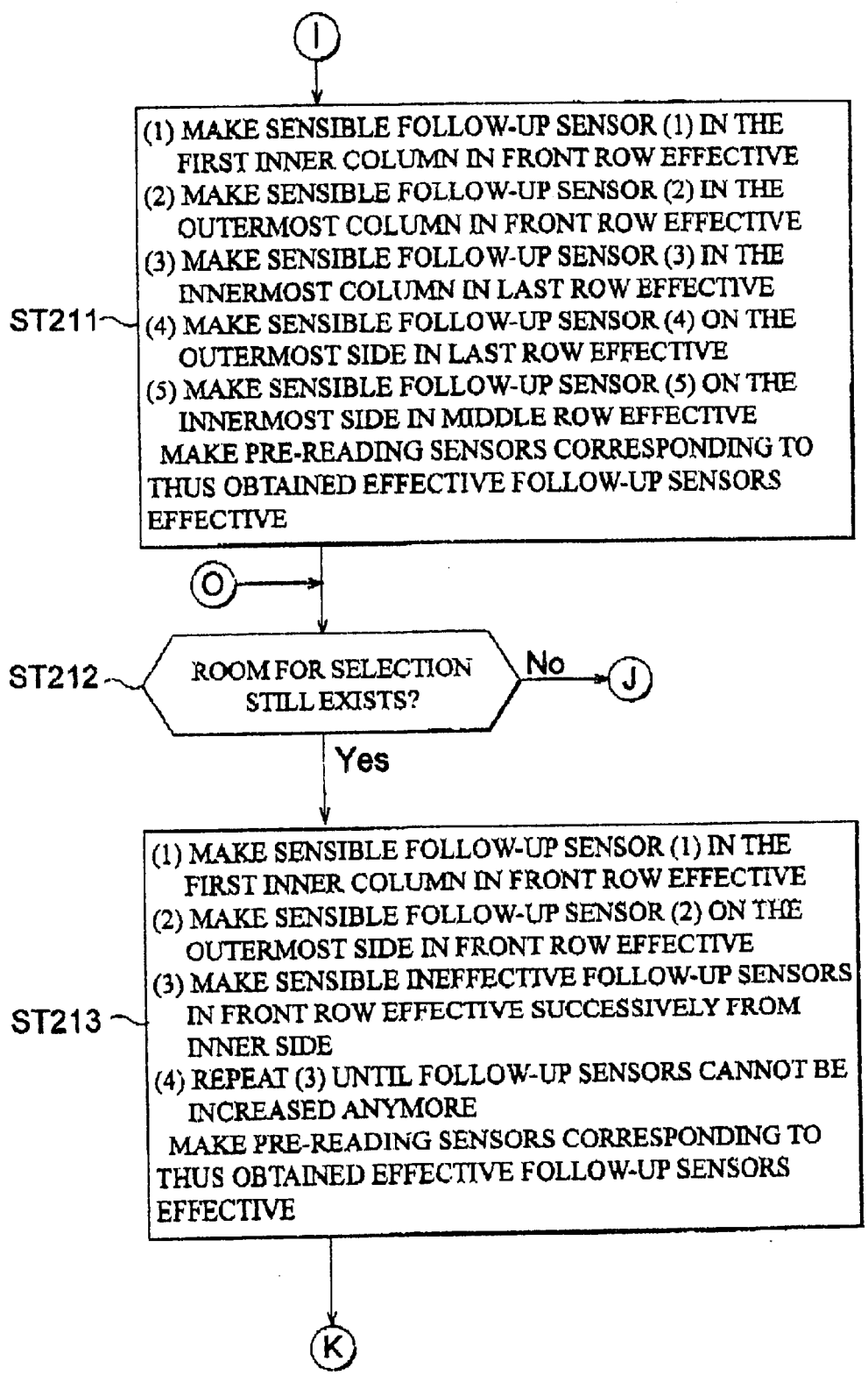
FIG. 26 is a flowchart fox explaining the case where sensors are allowed to be automatically selected in the second embodiment according to the present invention.

Returning to step ST152 in FIG. 22, if the initial setting is 1 that permits automatic selection, then the operation proceeds to the flowchart shown in FIG. 26. The relationships between the exposure area and sensor arrangement corresponding to the individual steps in this flowchart are shown in FIGS. 27 to 30.

FIG. 26 is a flowchart showing selection algorithms in the case where automatic selection of sensor is permitted. If it is judged at step ST152 that the automatic selection is possible, then the flow proceeds to step ST211. Step ST211 shows the standard and order of selection of follow-up sensors in the case where the sensors are arranged in four rows in total comprising three rows of follow-up sensors and one row of pre-reading sensors.

At step ST211, sensors are selected as much as possible in the following order (1) to (5). The maximum number of selectable sensors is stored in the memory 200 of the main control unit 20 beforehand, or specified by a user. For example, if no more selection is possible at (3), then step ST211 is terminated, and the flow proceeds to the next step.

First, whether selection is possible or not depends on the upper limit of the number of sensors that can be placed in the usable state in the exposure apparatus used, for example. This maximum number is, for example, preset into the memory 200 of the main control unit 200 included in the exposure apparatus by way of the I/O device 201 or specified by the user. For example, if the upper limit number is 9, 9 pieces out of 45 pieces in total of sensors can be placed in the usable state. No selection can be made beyond this number.

This judgment also depends on the number of sensors which can cover the effective area of the substrate at the position during the judgment. When this area is narrow, there may be an extreme case where only one piece at a corner can be selected.

The sensor selecting step at step ST211 will be explained. In this embodiment, the basic standard for selection is to select the front and last rows and the innermost and outermost sides where possible. As noted in the following, the order is such that the inner side is processed after the outer edge is defined.

(1) First, in the front (leading) row, a sensible sensor, i.e., the one capable of focusing, located inside the wafer surface is selected and made effective. Here, the sensor made effective (the sensor in the usable state) is the sensor $S_{42}$ indicated by 1 within a rhombus mark in FIG. 29. In this case, it coincides with the one left effective among the specified sensors. The pre-reading sensor $S_{52}$ corresponding to the sensor $S_{42}$ is automatically made effective, which also coincides with a specified sensor.

Figure 29:
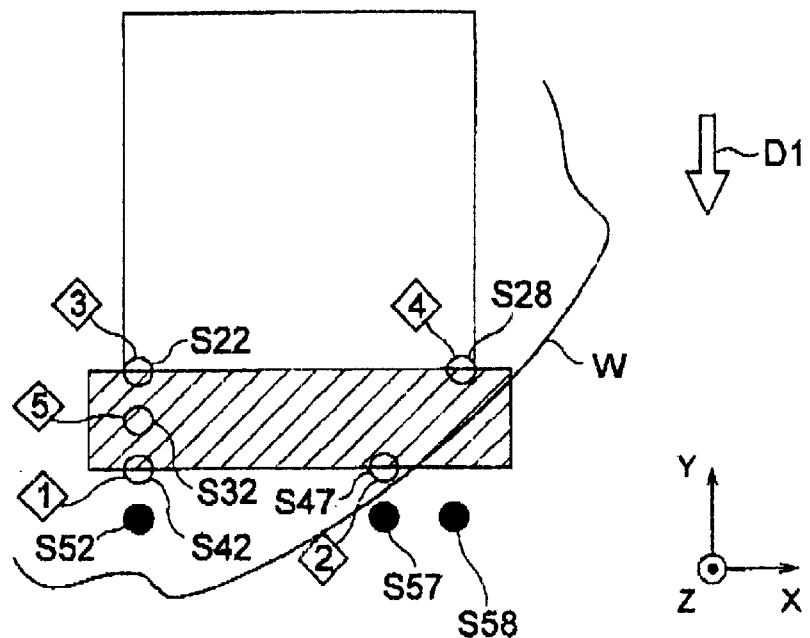
FIG. 29 is a (first) view for explaining, in the second embodiment according to the present invention, a scanning operation directed from the inside to outside of the substrate in terms of the relationship between exposure area and arrangement of sensors.

FIG. 29 is a view in the case of scanning from the inside to outside of the wafer W surface along the arrow D1. In this drawing, the rear end of the exposure area slit IA (FIG. 2) whose longitudinal axis extends along X direction is located at a position (circumscribing position) in contact with the exposure termination end of the rectangular exposure area. Here, "rectangular exposure area" refers to a rectangular area (which may be a square) assuming a state where the shot has no chipped portion.

(2) Subsequently, the sensible sensor located closest to the outer periphery of the wafer W surface in the front row is selected and made effective. In FIG. 29, the sensor made effective here is the sensor $S_{47}$ indicated by 2 in a rhombus mark. It may coincide with the one left effective among the specified sensors. In this case, since it has already been effective, there is no need to newly select and add it. In the case where the specified sensor is, for example, $S_{48}$ in FIG. 3, and $S_{48}$ has already been eliminated $S_{42}$ may be newly selected to be added. The pre-reading sensor $S_{57}$ corresponding to the sensor $S_{47}$ is also automatically made effective.

(3) The sensible sensor on the innermost side in the last row is selected and made effective. The sensor made effective here is the sensor $S_{22}$ indicated by 3 in a rhombus mark in FIG. 29. It coincides with the one left effective among the specified sensors in this case as well.

(4) Subsequently, the sensible sensor on the outermost side in the last row is selected and made effective. The sensor made effective here is the sensor $S_{28}$ indicated by 4 in a rhombus mark in FIG. 29. The pre-reading sensor $S_{58}$ corresponding to the sensor $S_{26}$ is also automatically made effective.

(5) Then, the sensible sensor on the innermost side of the wafer surface in a row between the front and last rows is selected and made effective. The sensor made effective here is the sensor $S_{22}$ indicated by 5 in a rhombus mark in FIG. 29.

The above-mentioned (1) to (5) indicates the order of adding sensors, whereas the specified sensors $S_{35}$ and $S_{15}$ are not depicted. Consequently, the sensor $S_{12}$ is not added in practice in the case where the upper limit number of sensors is set to 9.

As explained in the foregoing, in any case, when a follow-up sensor is made effective, its corresponding pre-reading sensor aligning therewith in the same column is made effective. Namely, when the follow-up sensors $S_{42}$, $S_{47}$, and $S_{28}$ are made effective, the pre-reading sensors $S_{52}$, $S_{57}$, and $S_{56}$ are made effective, respectively. In terms of accuracy, it is preferred that presetting be made such that, in the case where the upper limit value for sensor selection is reached by adding a follow-up sensor, whereby its corresponding pre-reading sensor cannot be added, the addition of this follow-up sensor is invalidated. Here, it is also possible to make setting such as to add follow-up sensors alone.

After the selection is terminated at step ST211, the flow proceeds to step ST212, where it is judged whether there are selectable sensors remain or not. If the judgment is negative, then there is no more room for selection, whereby the flow returns to step ST153 in FIG. 22.

If the judgment at step ST212 is positive, then there is still a room for selecting and adding a sensor, whereby the flow proceeds to step ST213. At step ST213, sensors are selected according to the order from (1) to (4) as follows.

(1) First, in the front row, a sensible sensor, i.e., the one capable of focusing, located in the first inner column is selected and made effective. Here, the sensor made effective is the sensor $S_{42}$ indicated by 1 within a rhombus mark in FIG. 30.

(2) The sensible sensor located on the outermost side in the front row is selected and made effective. Here, the sensor made effective is the sensor $S_{47}$ indicated by 2 within a rhombus mark in FIG. 30. While it may coincide with the one left effective among the specified sensors, it is handled in the same manner as in the case of FIG. 29.

Since the algorithm of (1) and (2) mentioned above is similar to that explained with reference to FIG. 29, such a selection has already been done in the case of carrying out the sensor selections of (1) and (2) subsequently to the selection explained with reference to FIG. 29. In such a case, the sensor selection would substantially begin with (3).

Figure 30:
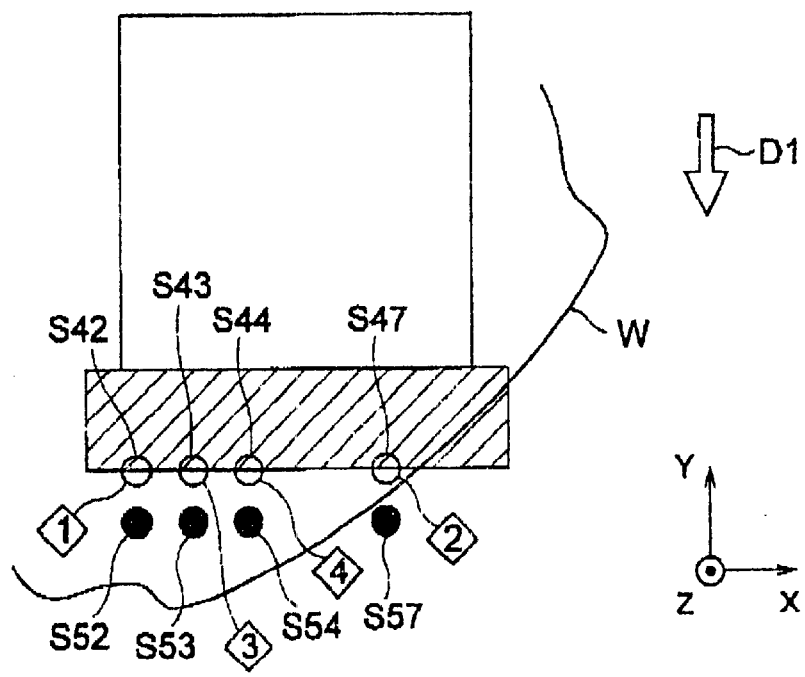
FIG. 30 is a (second) view for explaining, in the second according to the present invention, a scanning operation directed from the inside to outside of the substrate in terms of the relationship between exposure area and arrangement of sensors.

(3) In the front row, sensible follow-up sensors which have not yet been made effective are selected and made effective successively from the inner side where possible. In the case of FIG. 30, the sensor $S_{43}$ adjacent to the already effective sensor $S_{42}$ is added, and its corresponding pre-reading sensor $S_{53}$ is automatically added.

(4) In the front row, sensible follow-up sensors are successively selected from the inner side, and this step ST213 is terminated when the upper selectable limit number (the value set in the apparatus or specified by the user) is reached or all the sensible follow-up sensors are selected in the front row.

In the foregoing, in any case, as with the case of FIG. 29, when a follow-up sensor is made effective, its corresponding pre-reading sensor aligning therewith in the same column is made effective.

After the selection is completed at step ST213, the flow returns to step ST153 in FIG. 22.

This sequence of (1) to (4) may also be employed for adding sensors in the case of FIG. 12 in the first embodiment.

In each of the above-mentioned embodiments, when scanning from the inside to outside of the wafer surface, whether a sensor is sensible or not is judged at a circumscribing position as shown in FIGS. 29 and 30. It is due to the fact that follow-up sensors are usually required to be sensible at the time of terminating exposure. Consequently, in the scanning from the outside to inside of the wafer surface in the foregoing embodiments, leveling is not assumed to be carried out in X direction alone. Nevertheless, even when scanning from the inside to outside of the wafer surface, leveling in X direction (together with focusing in Z direction) may be carried out while abandoning leveling in Y direction, so as to effect exposure as much as possible. In this case, with one row of sensors in X direction left alone, whether sensors are sensible or not is judged at a position (inscribing position) where the front end of the exposure area slit IA (FIG. 2) whose longitudinal axis extends along X direction is in contact with the exposure termination end of the rectangular exposure area. The front row is used as the one row for leaving the sensors. Then, the sensors are selected as in the case of step ST213. Here, even when the sensors made effective are located outside the exposure termination end, exposure still continues. Thereafter, exposure is carried out in the state where leveling and focusing are not appropriately effected. Nevertheless, this state still conforms to the idea of exposing parts as much as possible for achieving complete exposure of the adjacent shot areas.

Also, when scanning from the inside to outside of the wafer surface, in the case where leveling in X direction is performed while abandoning leveling in Y direction, so as to attain exposure as much as possible, whether sensors are sensible or not may be judged at a circumscribing position, while the last row is used as the one row for leaving sensors. Then, as with step ST213, sensors are selected such that they are successively made effective from the inner side of the wafer surface. Here, the sensors made effective are located at the exposure termination end of the exposure area at the time of terminating exposure. Also, this case can conform to the idea of exposing parts as much as possible for achieving complete exposure of the adjacent shot areas, even if abandoning leveling in Y direction.

In the following, with reference to the flowcharts of FIGS. 23 to 25, the scanning from the outside to inside of the wafer surface in the second embodiment will be explained. In this case, since scanning is carried out from the outside to inside of the wafer surface, eight pieces in total comprising five pieces of follow-up sensors and three pieces of pre-reading sensors $S_{12}$, $S_{15}$, and $S_{18}$ are set to the usable state. If the scanning is judged at step ST2 in FIG. 5 to be effected from the outside to inside of the wafer surface, then the flow proceeds to step ST251 in FIG. 23. In step ST251, it is judged whether all the follow-up sensors in the usable state at this time are sensible or not. If this judgment is positive, all the sensors are sensible, thus allowing XYZ control, whereby the flow proceeds to step ST13 (FIG. 5), and normal auto-focusing/auto-leveling is carried out.

If the judgment at step ST251 is negative, at least one follow-up sensor is insensible, whereby the flow proceeds to step ST252, and the insensible sensors are eliminated to leave sensible sensors. Then, the flow proceeds to step ST253.

At step ST253, whether the initial setting is 1 or 2 is judged. If the initial setting is 1, sensors are allowed to be automatically selected, whereby the flow proceeds to step ST211 in FIG. 26. This process will be explained later.

If the initial setting is judged to be 2 at step ST253, no sensors are allowed to be automatically selected, whereby the flow proceeds to step ST254, where it is judged whether or not XY-leveling is possible with the follow-up sensors made effective at this time. Namely, since the scanning is carried out from the outside to inside of the wafer surface, it is judged whether or not the follow-up sensors in Y direction are sensible at the exposure start position and the spacing width of sensible follow-up sensors in the front row is sufficient for X-leveling.

If the judgment at step ST254 is positive, then the flow proceeds to step ST255, where effective sensors are used for carrying out XYZ control, so as to effect auto-focusing/auto-leveling. Thereafter, the flow proceeds to step ST500, thus terminating the adjustment operation.

If the judgment at step ST254 is negative, leveling cannot be done in both X and Y directions. Then, leaving a possibility of X leveling, the flow proceeds to step ST256 shown in FIG. 24.

Since Y-leveling has already been abandoned, it is meaningless to leave sensors in Y direction. Then, at step ST256, the sensors in the second row and later are eliminated. Thereafter, the flow proceeds to step ST257, where it is judged whether the initial setting is 1 or 2.

If the initial setting is 1, sensors are allowed to be automatically selected, whereby the flow proceeds to step ST212 shown in FIG. 26. This process will be explained later.

Figure 27:
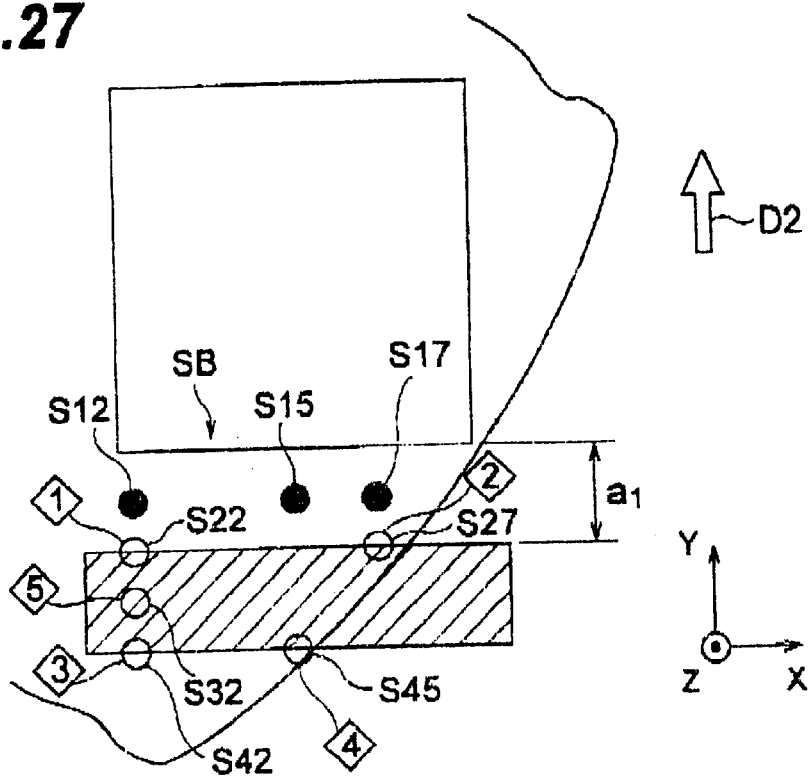
FIG. 27 is a (first) view for explaining, in the second embodiment according to the present invention, a scanning operation directed from the outside to inside of the substrate in terms of the relationship between exposure area and arrangement of sensors.

If the initial setting is 2, sensors are not allowed to be automatically selected, whereby the flow proceeds to step ST258, where it is judged whether X-leveling is possible or not with the follow-up sensors in the usable state. Namely, it indicates the state in which the exposure start position, i.e., the front end of the exposure area slit IA (FIG. 2) whose longitudinal axis extends along X direction in the case of FIG. 27, is located in front of the position where it is in contact with the exposure start end of the rectangular exposure area by the distance $a_1$. Here, "rectangular exposure area" corresponds to that explained with reference to FIGS. 29 and 30. The distance $a_1$ is a traveling distance necessary for settling Y-leveling as explained with reference to FIG. 16.

If the judgment at step ST258 is positive, then the flow proceeds to step ST259, whereby the effective follow-up sensors are used for carrying out focusing in Z direction and X-leveling. Then, the flow proceeds to step ST500, thus terminating the adjustment operation.

Figure 25:
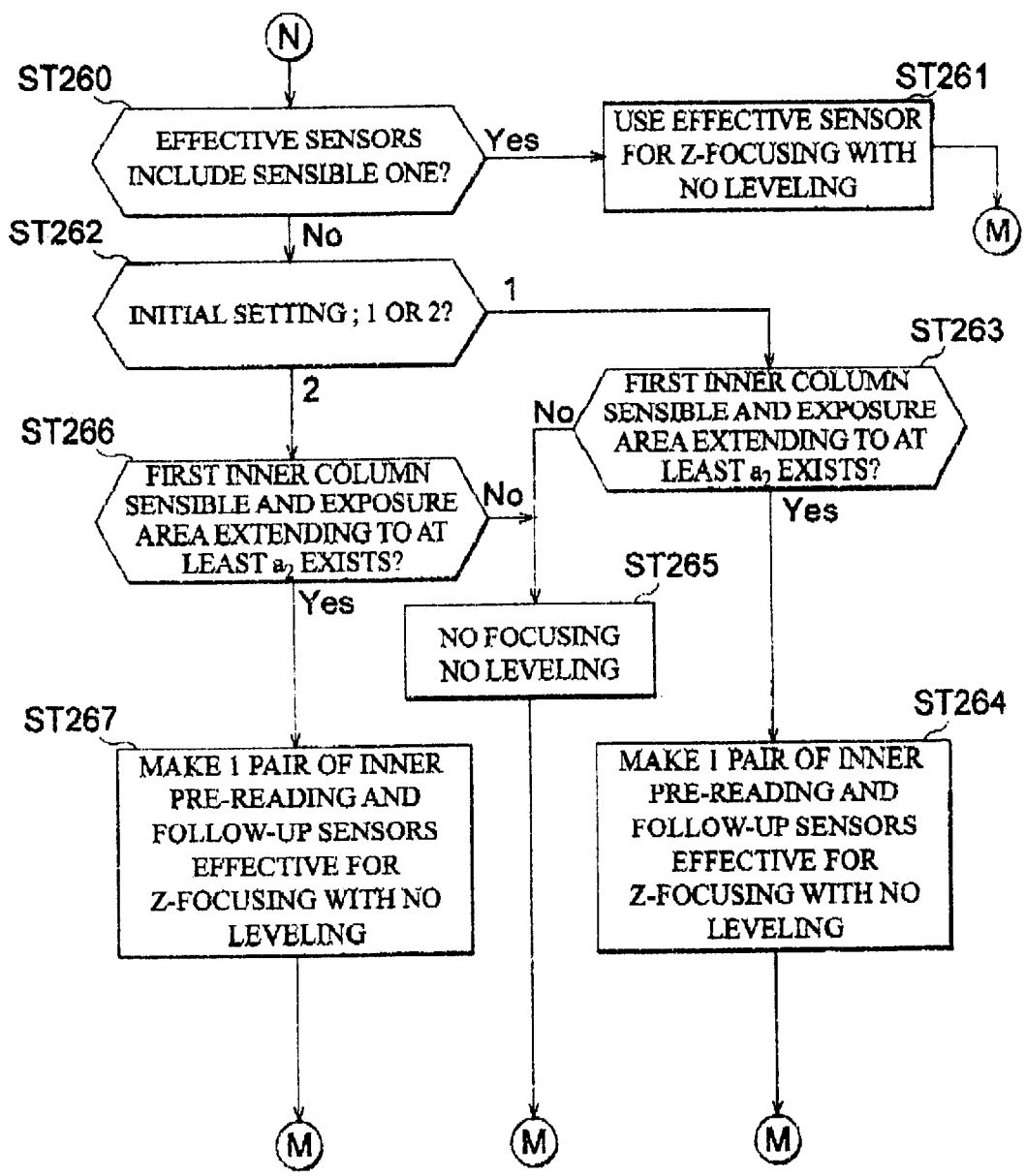
FIG. 25 is a flowchart for explaining operations subsequent to the flowchart shown in FIG. 24.

If the judgment at step ST258 is negative, then the flow proceeds to step ST260 in FIG. 25, leaving a possibility of focusing in Z direction, though X-leveling is impossible.

Figure 28:
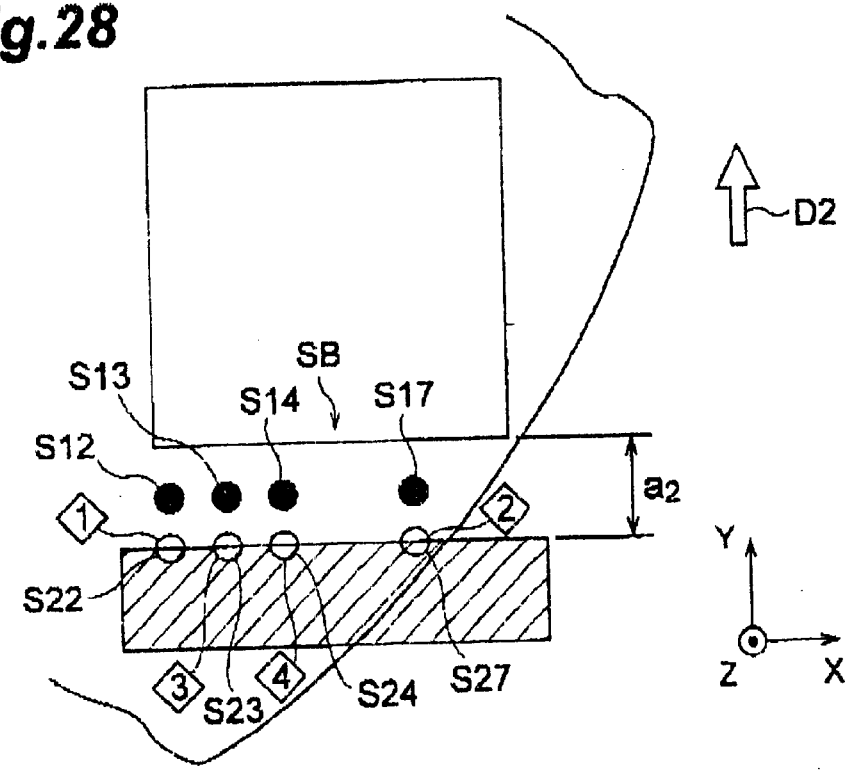
FIG. 28 is a (second) view for explaining, in the second embodiment according to the present invention, a scanning operation directed from the outside to inside of the substrate in terms of the relationship between exposure area and arrangement of sensors.

At step ST260, it is judged whether or not the follow-up sensors in the usable state include sensible ones. As shown in FIG. 28, the judging position indicates that the front end of the exposure area slit IA (FIG. 2) whose longitudinal axis extends along X direction is located in front of the position where it is in contact with the exposure start end of the rectangular exposure area by the distance $a_2$. Here, "rectangular exposure area" has the same meaning as that explained above. The distance $a_2$ is a traveling distance necessary for settling X-leveling as explained with reference to FIG. 17. Though FIG. 28 shows the case where the follow-up sensors in the front row are left effective, it may also be used as the view of the case taking account of the follow-up sensors in the front row while leaving the sensors in the subsequent rows.

If the judgment at step ST260 is positive, then the effective sensors are used for carrying out Z-focusing. Leveling is not effected since it is impossible. Then, the flow proceeds to step ST500, thus terminating the adjustment operation.

If the judgment at step ST260 is negative, then the initial setting is judged at step ST262. If it is judged to be 1, then the flow proceeds to step ST263. The case with the initial setting of "1" will be explained later.

If the initial setting is judged to be 2 at step ST262, then the flow proceeds to step ST266, where it is judged whether or not, among the (e.g., nine pieces of) sensors in the usable state, i.e., specified sensors, the follow-up sensor in the first inner column is sensible at the exposure end position and the exposure area extends to at least the distance $a_2$.

If the judgment at step ST266 is positive, the follow-up sensor in the first inner column of the wafer surface is sensible, whereby the flow proceeds to step ST267. In this step, the sensible inner follow-up sensor and the pre-reading sensor paired therewith are made effective, so as to allow Z-focusing. Leveling is not effected since it is impossible. Then, the flow proceeds to step ST500, thus terminating the adjustment operation.

If the judgment at step ST266 is negative, neither leveling nor focusing is possible, whereby the flow proceeds to step ST265, so as to set no focusing and no leveling. Then, the flow proceeds to step ST500, thus terminating the adjustment operation.

Figure 23:
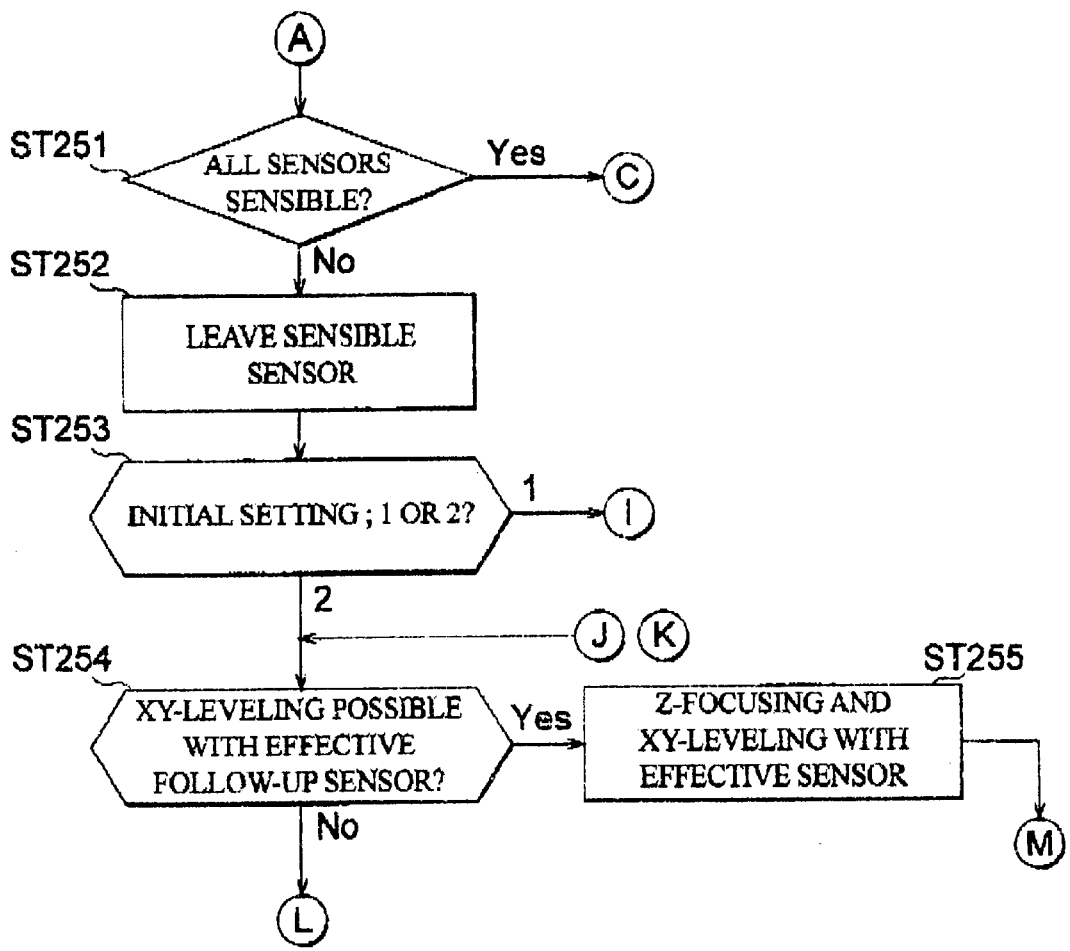
FIG. 23 is a (first) flowchart for explaining, in the second embodiment according to the present invention, a scanning operation directed from the outside to inside of the substrate.
Figure 24:
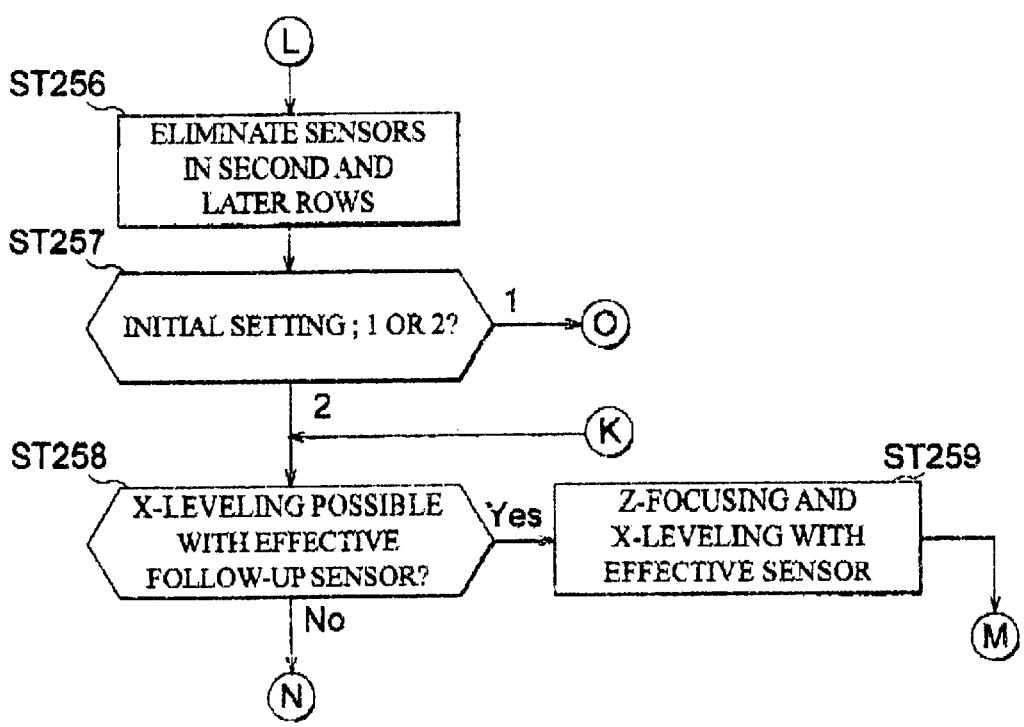
FIG. 24 is a flowchart for explaining operations subsequent to the flowchart shown in FIG. 23.

If the initial setting is judged to be 1 at step ST253 in FIG. 23, sensors are allowed to be automatically selected. Consequently, in this case, the flow proceeds to step ST211 in FIG. 26. At step ST211, according to the standard and order similar to those in the case of scanning from the inside to outside of the wafer surface explained with reference to FIG. 22, the follow-up sensors are selected. The judging position, however, is in the state where, as shown in FIG. 27, the exposure start position, i.e., the front end of the exposure area slit IA (FIG. 2), is located in front of the exposure start end of the rectangular exposure area by the distance $a_1$.

As with the scanning from the inside to outside of the wafer surface (FIG. 22), the following operations are carried out in FIG. 27.

(1) First, in the front row, the sensible sensor $S_{22}$, indicated by rhombus mark 1, located within the surface of wafer W is selected. In FIG. 22, it coincides with the one left effective among the specified sensors. The pre-reading sensor $S_{12}$ aligning with the sensor $S_{22}$ in the same column is also made effective.

(2) Subsequently, the sensible sensor on the outermost side in the front row is selected. It is the sensor $S_{27}$ indicated by rhombus mark 2 in FIG. 27. Since the specified sensor $S_{28}$ is not located on the wafer, it is eliminated as ineffective. The pre-reading sensor $S_{17}$ aligning with the sensor $S_{27}$ in the same column is also made effective.

(3) Then, the sensible follow-up sensor $S_{42}$ (specified sensor) on the innermost side of the wafer surface in the last row, as indicated by rhombus mark 3, is made effective.

(4) Also, the sensible follow-up sensor $S_{45}$ (specified sensor) closest to the outer peripheral portion of the wafer surface in the last row, as indicated by rhombus mark 4, and the pre-reading sensor $S_{19}$ aligning therewith in the same column are made effective.

(5) Then, as indicated by rhombus mark 5, the sensible sensor $S_{32}$ on the innermost side in a row between the front and last rows is made effective.

When sensors are sensible here, they can be used to focusing since the traveling distance $a_1$ required for settling Y-leveling is secured. The standard and order of selection will not be explained here since they are similar to those explained above.

If there is no room for sensor selection after step ST211, then the flow returns to step ST254 in FIG. 23.

If there is still a room for selecting sensors after step ST211, then the flow proceeds to step ST213, whereby follow-up sensors are selected according to the standard and order similar to those in the case of scanning from the inside to outside of the wafer surface explained with reference to FIG. 22. The standard and order of selection will not be explained here since they are similar to those explained above. After step ST213, the flow returns to step ST254. Thereafter, the procedure similar to that explained above will be carried out.

If the judgment at step ST254 is made negative, and the initial setting is judged to be 1 at step ST257, sensors are allowed to be automatically selected. As a consequence, the flow successively proceeds to steps ST212 and ST213 in FIG. 26. In steps ST212 and ST213, follow-up sensors are selected according to the standard and order similar to those in the case of scanning from the outside to inside of the wafer surface explained with reference to FIG. 22.

The judging position, however, is in the state where, as shown in FIG. 28, the exposure start position, i.e., the front end of the exposure area slit IA (FIG. 2), is located in front of the exposure start end of the rectangular exposure area by the distance $a_2$. If a sensor is sensible here, then it can be used for X-leveling and focusing since the traveling distance $a_2$ required for settling X-leveling is secured. The sequence of selection will not be explained here, since it is similar to that already explained with reference to FIG. 30. Thereafter, the flow returns to step ST258.

The subsequent sequence is similar to that explained with reference to FIGS. 24 and 25. If the initial setting is "1" at step ST262, then the flow proceeds to step ST263.

At the exposure end position, it is judged whether or not, among all the prepared sensors (45 pieces in the example of FIG. 3), the follow-up sensor in the first inner column is sensible and the exposure area extends to at least the distance $a_2$. Whether or not there is at least the distance $a_2$ is judged due to the fact that, even when there is a sensible follow-up sensor at the exposure end position, focusing cannot be effected after all unless the distance from the position of the sensor to the end of the exposure area in the scanning direction is at least the distance $a_2$, which is an approach length required for X-leveling.

Here, all the prepared sensors refer to all the sensors existing within the sensor range defined by the specified sensors. For example, if the sensors $S_{12}$, $S_{15}$, $S_{18}$, $S_{22}$, $S_{25}$, $S_{28}$, $S_{38}$, $S_{42}$, $S_{45}$, $S_{48}$, $S_{52}$, $S_{55}$, and $S_{58}$ are specified sensors, all the prepared sensors are all the sensors existing within the rectangular area surrounded by the sensors $S_{12}$, $S_{18}$, $S_{52}$, and $S_{58}$.

If the judgment at step S263 is positive, then a pair of the follow-up sensor and its corresponding pre-reading sensor are selected and made effective, so as to effect Z-focusing. Leveling is not carried out since it is impossible. Then, the flow proceeds to step ST500, thus terminating the adjustment operation.

If the judgment at step ST263 is negative, neither leveling nor focusing is possible, whereby the flow proceeds to step ST265, at which all the sensors are set ineffective, i.e., no focusing and no leveling are set. Then, the flow proceeds to step ST500, thus terminating the adjustment operation.

As explained in the foregoing, in accordance with the first and second embodiments of the present invention, optimal focus control is possible at the time of scanning exposure directed from the inside to outside of the wafer surface for any marginal shot area, thereby making it possible to prevent intolerable defocusing states from occurring. As a consequence, color inconsistencies can be prevented from occurring due to defocusing.

Also, the optimal focus control can be effected in the scanning exposure directed from the outside to inside of the wafer surface.

Each of the above-mentioned embodiment explains the cases where judgments for (i) focusing in Z direction and X-tilt control, (ii) focusing in Z direction and X- and Y-tilt control, and (iii) Z-direction focusing control alone are effected according to the flowcharts of FIGS. 5 to 9 or FIGS. 22 to 26. However, without being restricted thereto, for example, the positional relationship between each shot area and a wafer edge can be determined at the time when an exposure map concerning which shot arrangement should be employed on the wafer W and in which exposure order the exposure should be performed. As a consequence, for each shot area, which of (i) to (iii) is used for surface position adjustment may be prepared as table data and stored in the memory 200, and the surface position adjustment may be performed according to these table data upon scanning exposure.

Also, the judging function for the controlling method and the addition of sensor selecting function such as those mentioned above can be realized by simple modifications of software.

The above-mentioned embodiments may also be applied to EB (electron beam) exposure apparatus and X-ray exposure apparatus. The projection optical system may be not only a refractive system but also either a catadioptric or reflective system. It is an electromagnetic lens in the case of EB exposure apparatus. Also, without being restricted to a projection system, it may be applied to proximity exposure apparatus as well.

The scanning from the inside to outside of the wafer surface or from the outside to inside of the wafer surface in the foregoing explanation is used in the following meaning. Namely, let the origin of XY coordinates in a rectangular coordinate system be placed at substantially the center of a substrate surface, and the scanning be performed in the Y-axis direction. Then, on the substrate corresponding to the first and second quadrants, the scanning directed to the positive side of Y axis is referred to as the scanning from the inside to outside of the wafer surface (inside-to-outside scanning), whereas the scanning directed to the negative side of Y axis is referred to as the scanning from the outside to inside of the wafer surface (outside-to-inside scanning). In the third and fourth quadrants, on the other hand, the scanning directed to the negative side of Y axis is referred to as the scanning from the inside to outside of the wafer surface, whereas the scanning directed to the positive side of Y axis is referred to as the scanning from the outside to inside of the wafer surface. For example, in FIG. 10, the downward arrow D1 (toward the negative side of Y axis) indicates the scanning direction from the inside to outside of the wafer W surface. It is due to the fact that FIG. 10 illustrates, of the substrate, the portion corresponding to the fourth quadrant. FIGS. 11 to 21 are similar to this regard. In FIGS. 10 to 21 or FIGS. 27 to 30, however, the XY coordinates are shown as those having directions and orientations, without their origins being located at the center of the substrate. Also, the inner side and outer side of the wafer surface along X-axis direction are defined such that, in any quadrant in the XY coordinates whose origin is located at the center of the substrate, the side closer to Y axis is referred to as the inner side, whereas the side farther from Y axis is referred to as the outer side.

As explained in the foregoing, the present invention yields conventionally unexpected excellent results in that it can prevent color inconsistencies from occurring due to defocusing upon exposure.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An exposure method in which, while a predetermined energy beam and a substrate are moved relative to each other in a predetermined scanning direction, a pattern is transferred to a plurality of shot areas formed on said substrate, said method comprising:
   detecting focus information of said substrate according to information from a focus detection system having a plurality of detection points on said substrate during the relative movement of said energy beam and said substrate;
   selecting at least one of effective detection point from said plurality of detection points corresponding to respective shot areas based on a shot map data indicating positional information of said shot areas on said substrate; and
   determining a shot area to be exposed without controlling an inclination of said substrate, according to a positional relationship between said shot areas on said substrate and said effective detection point.

2. An exposure method according to claim 1, wherein said determining of the shot area comprises determining, according to the positional relationship between said substrate, said shot areas, and said detection area, whether the focus information of said substrate can be detected or not.

3. An exposure method according to claim 1, wherein, during said determining of the shot area, whether or not to control the inclination of said substrate is judged according to a positional relationship between, of a sensor group arranged such as to correspond to a plurality of detection points included in said detection area, a detection point corresponding to a sensor in a usable state, a shot area on said substrate, and said substrate.

4. An exposure method according to claim 3, further comprising:
   executing, based on a result of said determining of said shot area, according to a positional relationship between the detection point corresponding to said sensor in the usable state, a predetermined shot area on said substrate, and said substrate, at least one of a first adjustment operation for adjusting of focal position of said substrate and a second adjustment operation for adjusting the inclination of said substrate.

5. An exposure method according to claim 4, wherein at least one of said first and second adjustment operations is executed when the detection point corresponding to said sensor in the usable state is located at an exposure and position in said predetermined shot area.

6. An exposure method according to claim 4, wherein said sensor in the usable state includes a sensor selected for an immediately preceding shot area subjected to exposure.

7. An exposure method according to claim 4, wherein, in said second adjustment operation, when the detection point corresponding to said sensor in the usable state includes a detection point arranged along said predetermined scanning direction, the inclination of said substrate is adjusted with reference to said predetermined scanning direction, whereas, when the detection point corresponding to said sensor in the usable state includes a detection point arranged along a direction orthogonal to said predetermined scanning direction, the inclination of said substrate is adjusted with reference to said direction orthogonal to said predetermined scanning direction.

8. An exposure method according to claim 1, further comprising:
   preparing the shot map recording a form of each shot area on said substrate.

9. An exposure method according to claim 1, further comprising:
   preparing the map indicating a sensible sensor at an exposure and position for each shot area on said substrate; and
   executing, according to a positional relationship between a detection point corresponding to the sensor indicated by said map and a predetermined shot area on said substrate, at least on of a first adjustment operation for adjusting a focal position of said substrate and a second adjustment operation for adjusting the inclination of said substrate.

10. An exposure method according to claim 3, wherein, according to the positional relationship between the detection point corresponding to said sensor in the usable state and the shot area on said substrate, a sensor to be placed into the usable state is selected from said sensor group, so as to change the arrangement of said detection point.

11. An exposure method according to claim 10, wherein the number of sensors in the usable state is increased according to the positional relationship between the detection points corresponding to said sensors in the usable state and the shot area on said substrate.

12. An exposure method according to claim 10, wherein sensors located at positions satisfying a predetermined standard are selected from said sensor group according to a predetermined order.

13. An exposure method according to claim 1, further comprising:
   executing, according to a positional relationship between a shot area on said substrate and an edge of said substrate, at least one of a first adjustment operation for adjusting a focal position of said substrate and a second adjustment operation for adjusting the inclination of said substrate.

14. An exposure method according to claim 13, wherein said determining of the shot area comprises:
   determining a first condition that the distance from a shot area in which the scanning exposure has been completed to the next shot area to be subjected to scanning exposure is at least a predetermined value and a second condition that a detection point, included within said detection area, corresponding to the sensor in the usable state intersects the edge of said substrate as said substrate moves.

15. An exposure method according to claim 14, further comprising:
   selectively executing, when both of said first and second conditions are satisfied according to a result of said determining of the shot area, at least one of first and second control operations;
   said first control operation moving said substrate such as to perform scanning exposure from the inside or outside of said substrate;
   said second control operation moving said substrate such as to perform scanning exposure from the outside to inside of said substrate after at least one of said first and second adjustment operations is performed according to a result of said detecting of the focus information.

16. An exposure method according to claim 15, wherein said detection area is set such that at least a part of said detection area overlaps with an exposure area formed by said energy beam.

17. A semiconductor device made by the exposure method according to claim 1.

18. An exposure method of transferring a pattern of a mask onto a plurality of shot areas on substrate by relatively moving the mask and the substrate, the method comprising:

obtaining a shot map data indicating positional information of the plurality of shot areas in the substrate, and arrangement information of a plurality of measurement points of a surface position detecting system to detect a surface position of the substrate; and determining a shot area to be exposed without controlling an inclination of the substrate, on the basis of the obtained shot map data and arrangement information.

19. An exposure method according to claim 18, wherein the information of the shot areas on the substrate includes information regarding whether the shot areas are p ositioned at a periphery portion of the substrate.

20. An exposure method according to claim 18, wherein the positional information of the shot areas on the substrate includes information regarding the positional relationship between an edge of the substrate and the shot areas.

21. An exposure method according to claim 20, wherein the edge of the substrate includes a pattern-inhibit area provided on a periphery portion of the substrate.

22. An exposure method according to claim 18, wherein the pattern of the mask is transferred onto the substrate through a projection optical system, and wherein the judgment of the judging step is performed on the basis of the positional relationship of a detection area of a detector, which detects a position of a surface of the substrate on an optical axis direction, the shot areas and an edge of the substrate.

23. An exposure method according to claim 18, wherein the pattern of the mask is transferred onto the substrate through a projection optical system, and wherein the determining of the shot area is performed on the basis of the positional relationship of a detection area of a detector, which detects a position of a surface of the substrate on an optical axis direction, the shot areas, and an edge of the substrate.

24. An exposure method according to claim 18, wherein the positional information of the plurality of shot areas on the substrate is obtained on the basis of a shot map to be set in advance.

25. A method of manufacturing a device, comprising a step of transferring a circuit pattern onto a work piece by using an exposure method according to claim 18.

* * * * *

UNITED STATES PATENT AND TRADEMARK OFFICE
CERTIFICATE OF CORRECTION

PATENT NO.      : 6,455,214 B1
DATED           : September 24, 2002
INVENTOR(S)     : Yuji Imai et al.

It is certified that error appears in the above-identified patent and that said Letters Patent is hereby corrected as shown below:

<u>Column 36,</u>
Line 57, after "inside" delete "or" and insert -- to --;

<u>Column 37,</u>
Line 16, change "p ositioned" to -- positioned --.

Signed and Sealed this

Twenty-fifth Day of November, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,455,214 B1
DATED : September 24, 2002
INVENTOR(S) : Yuji Imai et al.

It is certified that error appears in the above-identified patent and that said Letters Patent is hereby corrected as shown below:

Title page,
Item [57], ABSTRACT
Line 1, after "relates" delete ",".
Line 9, after "substrate" insert -- , --.

Column 36,
Line 57, after "inside" delete "or" and insert -- to --;

Column 37,
Line 16, change "p ositioned" to -- positioned --.

This certificate supersedes Certificate of Correction issued November 25, 2003.

Signed and Sealed this

Twenty-fifth Day of January, 2005

JON W. DUDAS
*Director of the United States Patent and Trademark Office*

UNITED STATES PATENT AND TRADEMARK OFFICE
CERTIFICATE OF CORRECTION

PATENT NO. : 6,455,214 B1 Page 1 of 1
APPLICATION NO. : 09/523293
DATED : September 24, 2002
INVENTOR(S) : Yuji Imai et al.

It is certified that error appears in the above-identified patent and that said Letters Patent is hereby corrected as shown below:

Title Page [12] UNITED STATES PATENT
change "Wakamoto et al." to --IMAI et al.--;

Title Page [75] Inventor: delete "Shinji Wakamoto";

Title Page [57] ABSTRACT
1st line, after "relates" delete ",";
9th line, after "substrate" insert --,--;

Column 36 line 57, (claim 15, line 8), after "inside" delete "or" and insert --to--;

Column 37 line 16, (claim 19, line 3), change "p ositioned" to --positioned--.

Signed and Sealed this

Seventeenth Day of April, 2007

JON W. DUDAS
*Director of the United States Patent and Trademark Office*